(12) United States Patent
Austin

(10) Patent No.: US 11,661,776 B2
(45) Date of Patent: May 30, 2023

(54) HOUSING FOR AN ELECTRICAL DEVICE

(71) Applicant: Vutiliti, Inc., Sandy, UT (US)

(72) Inventor: Micheal M. Austin, Sandy, UT (US)

(73) Assignee: Vutility, Inc., Sandy, UT (US)

( * ) Notice: Subject to any disclaimer, the term of this patent is extended or adjusted under 35 U.S.C. 154(b) by 23 days.

(21) Appl. No.: 17/204,539

(22) Filed: Mar. 17, 2021

(65) Prior Publication Data
US 2021/0293065 A1  Sep. 23, 2021

Related U.S. Application Data

(60) Provisional application No. 62/990,893, filed on Mar. 17, 2020.

(51) Int. Cl.
*E05D 7/10* (2006.01)
*E05D 5/14* (2006.01)
*H01F 27/02* (2006.01)

(52) U.S. Cl.
CPC ............. *E05D 7/1066* (2013.01); *E05D 5/14* (2013.01); *H01F 27/02* (2013.01)

(58) Field of Classification Search
CPC ... E05D 7/1066; E05D 7/1072; E05D 7/1077; E05D 5/14; E05D 7/1044
USPC .......................................................... 16/266
See application file for complete search history.

(56) References Cited

U.S. PATENT DOCUMENTS

| 106,315 | A | * | 8/1870 | Browne | ................... E05D 1/06 12/136 R |
| 132,053 | A | * | 10/1872 | Child | ...................... E05D 7/105 16/351 |
| 3,805,325 | A | * | 4/1974 | Lee | ........................... E05D 7/10 16/223 |
| 4,584,739 | A | * | 4/1986 | Konen | ................... E05D 7/105 16/266 |
| 4,663,803 | A | * | 5/1987 | Gora | ..................... E05D 7/1077 16/390 |
| 4,729,134 | A | * | 3/1988 | Hillebrand | ............. A47K 13/12 4/240 |

(Continued)

FOREIGN PATENT DOCUMENTS

| EP | 0071144 | 6/1985 |
| EP | 1911624 | 4/2008 |

(Continued)

*Primary Examiner* — Jeffrey O'Brien
(74) *Attorney, Agent, or Firm* — Foley & Lardner LLP

(57) ABSTRACT

The present disclosure provides a hinge, such as for housings for devices, such as a split-core current transformer. The housings can include hinges and housing parts to be rotatably coupled together at such hinges that can be injection molded. A hinge of a housing can include a first knuckle and a second knuckle, which can be integrally formed with or coupled to a first housing part and each are configured to receive an end of a hinge pin. One of the knuckles includes a knuckle slot to provide radial access for a cut-away portion of a hinge pin to pass through. At assembly of the first housing part to a second housing part, a first hinge pin end is to be disposed within an opening of the first knuckle and a second hinge pin end is to be disposed within the second knuckle after passage of the key portion through the knuckle slot of the second knuckle.

17 Claims, 15 Drawing Sheets

(56) References Cited

U.S. PATENT DOCUMENTS

| | | | | |
|---|---|---|---|---|
| 4,850,081 | A * | 7/1989 | Grant | E05D 11/087 16/257 |
| 5,125,523 | A * | 6/1992 | Kuiper | E05D 7/1077 220/4.23 |
| 5,269,046 | A * | 12/1993 | Newby, Sr. | E05D 7/1072 16/386 |
| 5,455,987 | A * | 10/1995 | Svehaug | E05F 1/063 16/385 |
| 5,669,106 | A * | 9/1997 | Daoud | E05D 7/105 16/265 |
| 5,910,029 | A | 6/1999 | Siedlik et al. | |
| 5,979,016 | A * | 11/1999 | Fan | E05D 7/1077 16/386 |
| 6,000,550 | A * | 12/1999 | Simpson | E05D 7/1077 16/257 |
| 6,336,249 | B1 * | 1/2002 | Plumley | E05D 5/04 16/225 |
| 6,338,181 | B1 * | 1/2002 | Hwang | B65D 43/166 16/386 |
| 6,363,576 | B1 * | 4/2002 | Hsu | H04N 1/00554 16/266 |
| 6,591,467 | B2 * | 7/2003 | Cardona | E05D 7/1077 29/451 |
| 6,678,919 | B1 * | 1/2004 | Sokolov | E05D 3/04 16/365 |
| 6,701,573 | B1 * | 3/2004 | Ciavarella | E05D 7/1055 16/268 |
| 6,742,823 | B2 * | 6/2004 | Guanzon | B60R 5/04 296/37.16 |
| 7,156,441 | B2 * | 1/2007 | Austin | E05F 1/1238 49/389 |
| 8,024,839 | B2 * | 9/2011 | Lewis, II | E05D 11/105 16/334 |
| 8,172,191 | B1 * | 5/2012 | Zimbalatti | F16M 11/10 248/688 |
| 8,281,459 | B2 * | 10/2012 | Le | E05D 11/1007 16/361 |
| 8,341,986 | B2 | 1/2013 | Sakai et al. | |
| 8,584,319 | B1 * | 11/2013 | Ludin | E05D 7/1061 16/262 |
| 10,550,989 | B2 | 2/2020 | Noggle et al. | |
| 10,590,687 | B1 * | 3/2020 | Cifers | E05D 7/1022 |
| 2003/0066165 | A1 * | 4/2003 | Hansen, II | E05D 5/125 16/266 |
| 2011/0085297 | A1 * | 4/2011 | Wright-Johnson | G06F 1/1681 361/679.55 |
| 2017/0362868 | A1 * | 12/2017 | Veloso | E05D 7/1005 |
| 2019/0339037 | A1 | 11/2019 | Burton | |
| 2020/0392773 | A1 * | 12/2020 | Valencia Flores | B60R 7/04 |
| 2021/0196085 | A1 * | 7/2021 | Placencia | E05D 11/0054 |
| 2021/0237656 | A1 * | 8/2021 | Fujita | B60R 7/06 |

FOREIGN PATENT DOCUMENTS

| | | |
|---|---|---|
| EP | 2357304 | 8/2011 |
| EP | 3128110 | 2/2017 |
| WO | 2018046880 | 3/2018 |

* cited by examiner

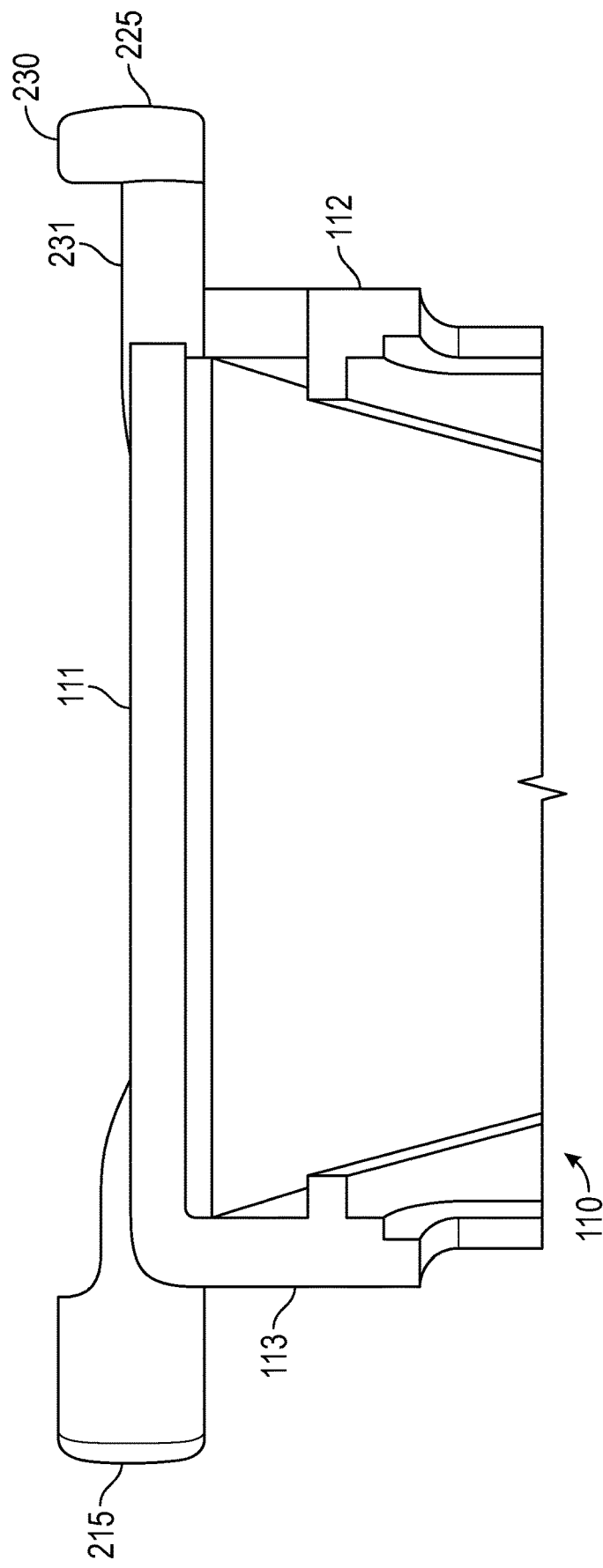

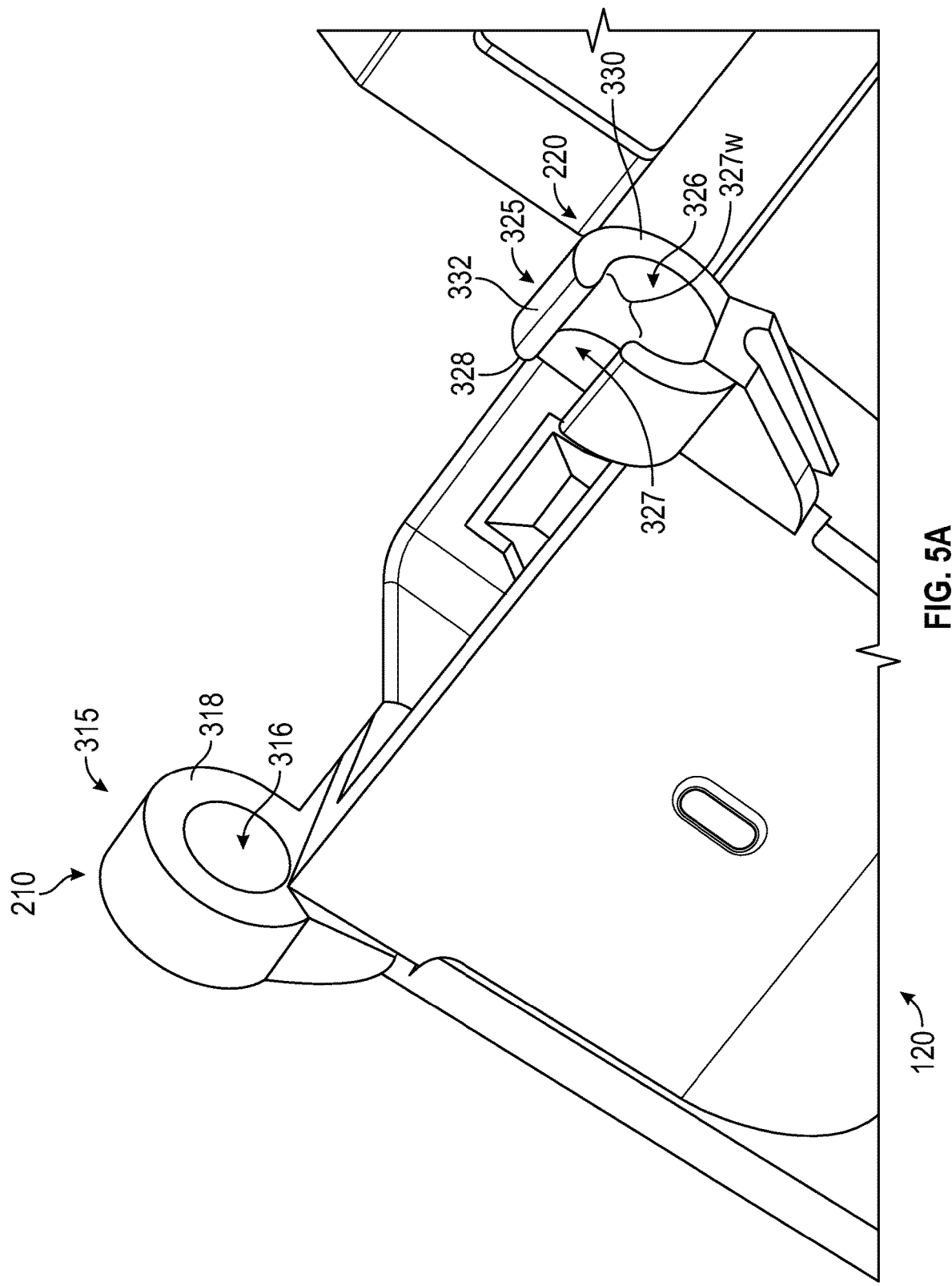

HOUSING FOR AN ELECTRICAL DEVICE

RELATED APPLICATIONS

The present application claims the benefit of priority under 35 U.S.C. Section 119(e) of U.S. Provisional Patent Application No. 62/990,893 entitled HOUSING FOR A SPLIT-CORE CURRENT TRANSFORMER, filed Mar. 17, 2020, which is hereby incorporated by reference herein in its entirety.

TECHNICAL FIELD

The present disclosure relates generally to the field of small plastic injection-molded housing parts that are hinged together. The features of the hinge can be integrally molded with the housing parts.

BRIEF DESCRIPTION OF THE DRAWINGS

The present embodiments will become more fully apparent from the following description and appended claims, taken in conjunction with the accompanying drawings. Understanding that the accompanying drawings depict only typical embodiments, and are, therefore, not to be considered limiting of the scope of the disclosure, the embodiments will be described and explained with specificity and detail in reference to the accompanying drawings.

FIG. 4A is a bottom detail view of a hinge portion of the upper housing part.

FIG. 5A is a detail perspective view of a hinge portion of the lower housing part.

DETAILED DESCRIPTION

Figure 1A:
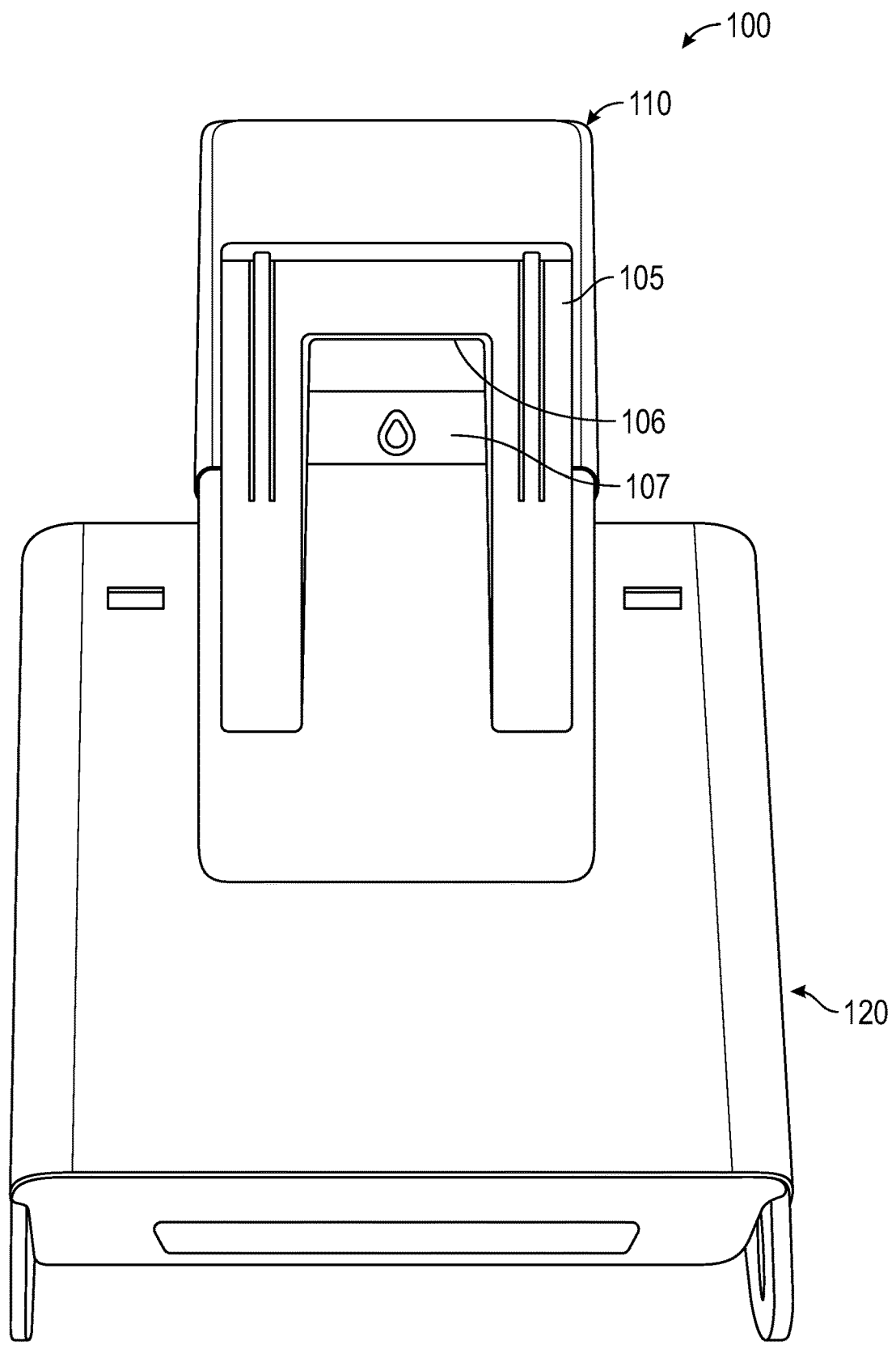
FIG. 1A is a front view of a housing, according to one embodiment.

Housings for components can provide support and/or protection for a device, such as for electronic components that perform a useful function. Typically, a housing comprises two parts that mate together or otherwise close together around the components or device to be housed. For example, a housing may be formed of two parts that can be snapped together after receiving the components or device to be housed within the housing.

A rotatable coupling of the two parts of the housing can ease assembly of the housing. To facilitate ease of assembly a hinge may rotatably couple the two parts of the housing and then rotate about the hinge to close the housing and latch, snap, or otherwise secure the two parts of the housing together in a closed state.

Housings that are mass-producible are desirable. Injection molding is one way to achieve a mass-producible housing. However, when mass-producing housings, including by injection molding, it can be difficult to create a hinge, and even more difficult to create a hinge that can be re-usable or otherwise operational for an extended, indeterminate, or unlimited number of times. Mass-producible housings with hinges are typically not formable with fewer than three components (that require tedious assembly) or formable to have an extended, indeterminate, or even unlimited life of operability. Further, hinges with three or more components are more likely to unintentionally or inadvertently disassemble (e.g., a hinge pin falling out) or otherwise be rendered in operable (e.g., wearing or binding due to lack of lubrication).

Other components besides housings may be highly in needed or desired such that mass-producibility is desirable. Plastic components and devices are often mass-produced by injection molding. Any relatively small rigid device or object that is needed or desired in large quantities is an appropriate candidate to be mass-produced, such as through injection molding. Again, however, when mass-producing any device, including by injection molding, it can be difficult to create a hinge, and even more difficult to create a hinge that can be re-usable or otherwise operational for an extended, indeterminate, or unlimited number of times. Mass-producible components or devices with hinges are typically not formable with fewer than three components (that may require tedious assembly) or formable to have an extended, indeterminate, or even unlimited life of operability.

A variety of living hinges have been designed that can be mass-produced, such as by injection molding or other processes. A living hinge is simply a thin flexible piece of material connecting two rigid components. The living hinge is generally formed or otherwise made from the same material as the two rigid components it connects. Typically, a living hinge is formed by reducing, cutting, shaving, or otherwise thinning a portion of the flexible material along a line in such a manner as to allow the rigid components to bend along the thinned line of the hinge. The minimal friction and very little wear in such a living hinge makes it useful, low cost, and easy to manufacture.

A living hinge, however, has a durability or operable life that may be limited by the quality of the material used, the quality of the design of the hinge, the operating or environmental conditions the hinge must operate in (e.g., freezing temps can make plastic brittle or unbendable), the care of the operator or care of operation of the hinge, the range of flex or motion over opening and closing, and/or the frequency of the cycles (open/close) of use. A high-quality living hinge may require high-quality materials that may be rated in quality higher than is needed for the rigid components being coupled by the living hinge, thereby driving up the complexity and/or cost of the device. A high-quality living hinge may require extra design considerations and/or engineering to correctly form, again driving up the complexity and price of the device. The durability of a living hinge may depend on how carefully the hinge is operated or otherwise cared for during operation, such that an ill-advised twisting, turning, pressing, or other force can produce undesired strain and severely limit the operable life of the living hinge. A living hinge that repeatedly opens and closes with large flex, over a wide range of motion, can also limit durability of the living hinge. Lastly, the frequency of cycles of opening and closing can impact durability such that high cycles in a period of time may limit or lengthen operability. Repeated cycles (opening and closing) of the hinge in rapid succession may result in undesirable wear and tear and decrease the operable life of the living hinge. By contrast, if the hinge is designed to repeatedly open and close in rapid succession, lack thereof may result in the hinge material becoming brittle. Finally simple stagnation (e.g., non-use or limited cycles) of the hinge over an extended period of time, or simply passage of time, can deteriorate the material causing the living hinge to become brittle, thereby decreasing the operable life of the living hinge.

The present inventor identified the desirability of a hinge that can be formed of two pieces (fewer than three pieces, such that a separate or discrete hinge pin is not included), easily assembled, not easily disassembled, mass-producible, and/or injection-moldable and have an extended operating life regardless of cycle frequency or quantity. Disclosed herein are embodiments of a housing comprising two housing parts that are easily assembled together to form a hinge about which the two housing parts can rotate with respect to each other. The two housing parts, once assembled to form the hinge, are not easily disassembled and can be opened and closed together over an extended, indeterminate, and/or unlimited life of operability. The two housing parts may be designed, shaped, and configured such that they can be mass-produced, such as by injection molding.

Some embodiments of the present disclosure are described herein with reference to a housing for a split-core current transformer. Some of the disclosed embodiments may be injection-moldable. However, the present disclosure is intended to encompass housings for other types of devices and any device that may include two components to be rotatably coupled, including devices formed by other than injection molding.

It will be readily understood that the components of the embodiments as generally described and illustrated in the figures herein could be arranged and designed in a wide variety of different configurations. Thus, the following more detailed description of various embodiments, as represented in the figures, is not intended to limit the scope of the disclosure, as claimed, but is merely representative of various embodiments. While the various aspects of the embodiments are presented in drawings, the drawings are not necessarily drawn to scale unless specifically indicated.

Moreover, the phrases "connected to" and "coupled to" are used herein in their ordinary sense and are broad enough to refer to any suitable coupling or other form of interaction between two or more entities. Two components may be coupled to each other even though they are not in direct contact with each other. The phrase "attached to" refers to interaction between two or more entities that are in direct contact with each other.

The term "opposite" is a relational term used herein to refer to a placement of a particular feature or component in a position corresponding to another related feature or component wherein the corresponding features or components are positionally juxtaposed to each other. By way of example, a person's right hand is opposite the person's left hand.

The terms "a" and "an" can be described as one, but not limited to one. For example, although the disclosure may recite an element, the disclosure also contemplates that the element can have two or more of that element.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Not every embodiment is shown in the accompanying illustrations; however, at least a preferred embodiment is shown. At least some of the features described for a shown preferred embodiment are present in other embodiments.

Figure 1B:
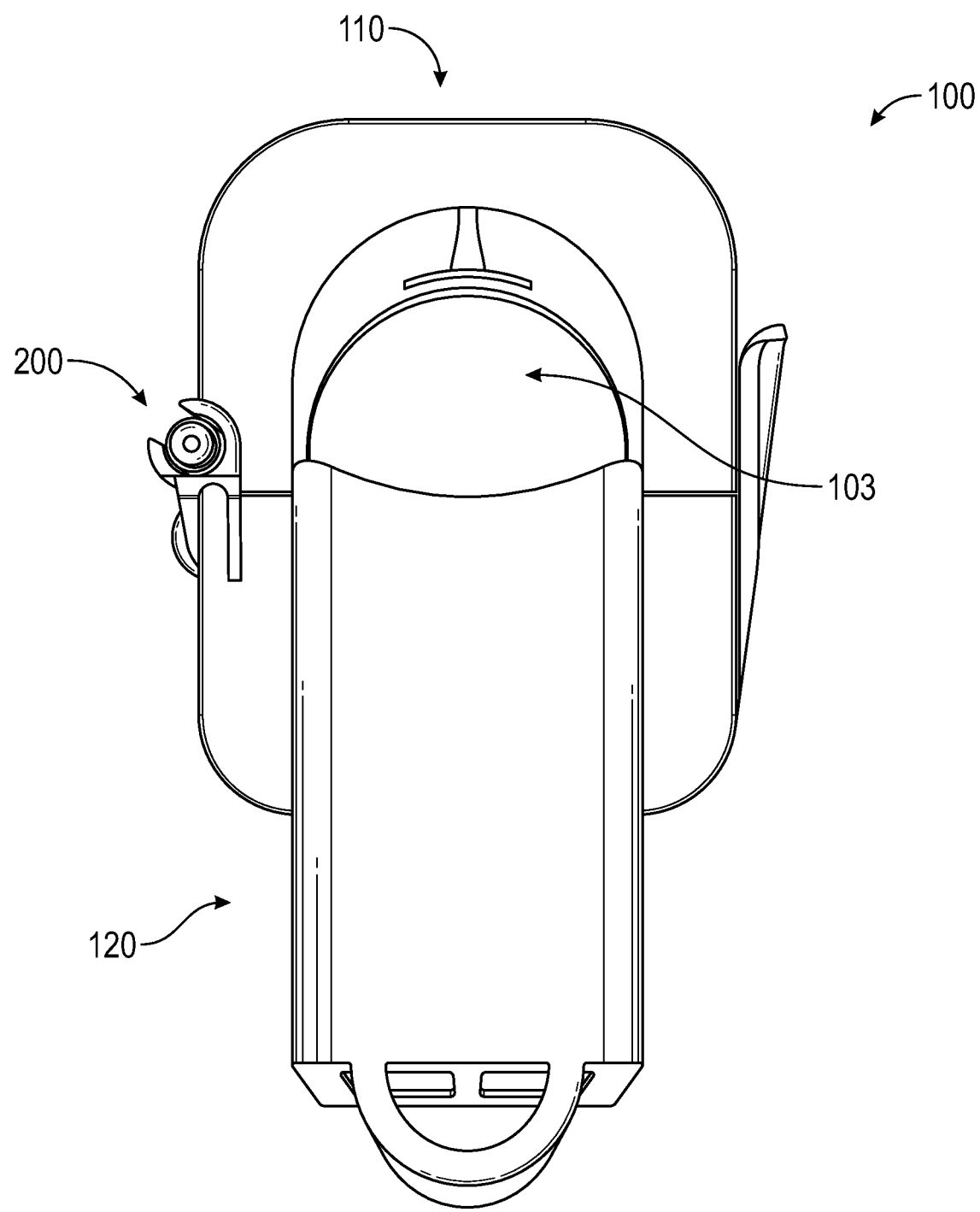
FIG. 1B is a side view of the housing of FIG. 1A.
Figure 1C:
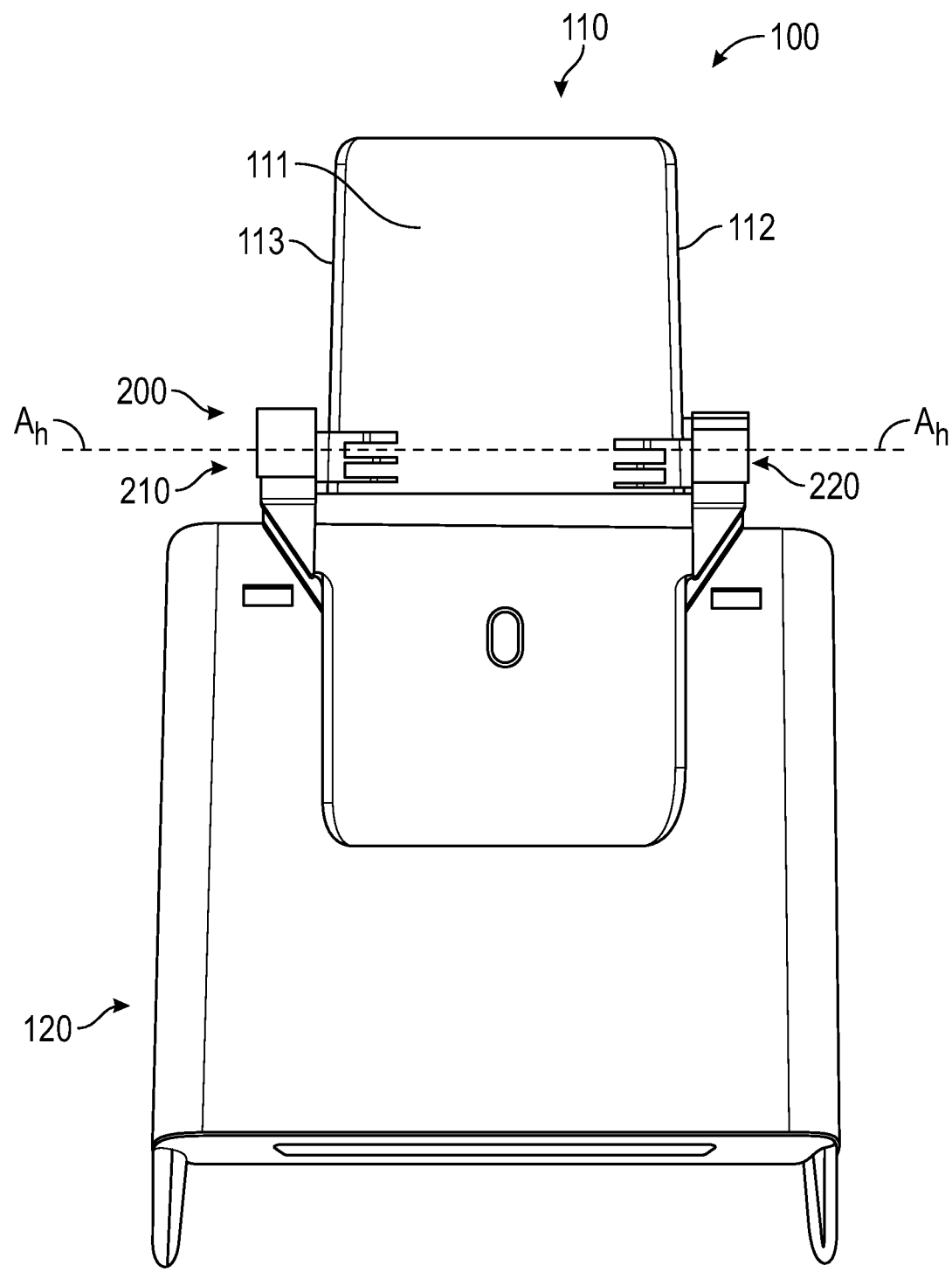
FIG. 1C is a rear view of the housing of FIG. 1A.

FIG. 1A is a front view of a housing 100, FIG. 1B is a side view of the housing 100, and FIG. 1C is a rear view of the housing 100. FIGS. 1A, 1B, and 1C show the housing 100 in a closed configuration. The housing 100 may comprise two housing parts: the upper housing part 110 and the lower housing part 120. In the illustrated embodiment of FIGS. 1A, 1B, and 1C, the housing 100 may include the upper housing part 110 and the lower housing part 120, both of which may be injection-molded plastic parts. Furthermore, any and all components of the upper housing part 110 and the lower housing part 120 may be integrally molded portions of the upper housing part 110 and/or the lower housing part 120. The upper housing part 110 and the lower housing part 120 are coupled together via a hinge 200 disposed at one side (e.g., a rear) of the housing 100. Accordingly, the hinge 200 may facilitate the housing 100 being selectively disposed in the closed configuration as shown in FIG. 1A and an open configuration (e.g., see FIG. 2). The upper housing part 110 may comprise a latch 105 that may be disposed at another side (e.g., the front opposite the hinge 200) of the housing 100. Manipulation of the latch 105 may facilitate the housing 100 being selectively transitioned from an unlatched configuration to a latched configuration when the housing 100 is disposed in the closed configuration. In some embodiments, the latch 105 may be configured to automatically transition the housing 100 from the unlatched configuration to the latched configuration upon full closure of the housing 100. For example, the latch 105 may be biased toward a latched configuration such that upon a lip 106 of the latch 105 passing over an edge of a protrusion 107, the latch 105 springs into place with the lip 106 engaging the edge of the protrusion 107. Similarly, the latch 105 may be manipulated to transition the housing 100 from the latched configuration to the unlatched configuration. For example, the latch 105 may be forced or bent outward to disengage the lip 106 from the protrusion 107 to release engagement.

The housing 100 is configured to receive electrical components of a split-core current transformer. The electrical components may include a pair of magnetic core halves (not shown in FIGS. 1A-1C, but see FIG. 9), which define the split-core portion of the current transformer. The magnetic core halves may be disposed inside the housing 100 such that one magnetic core half is disposed in the upper housing part 110 and the other magnetic core half is disposed in the lower housing part 120. The magnetic core halves may be U-shaped (or, C-shaped, half-ring-shaped, or other similar shape comprising or forming a partial cutout) so as to define an entirely enclosed or surrounded opening through the magnetic core halves when the ends of the magnetic core halves are aligned and coupled together. The opening may be configured to receive one or more conductors of electricity (e.g., wires) such that the magnetic core halves extend entirely around the one or more conductors. The opening through the magnetic core halves may at least partially align with an opening 103 (see FIG. 1B) of the housing 100 defined by the upper housing part 110 and the lower housing part 120. The opening 103 is correspondingly configured to receive the one or more conductors therethrough. The upper housing part 110 and the lower housing part 120 are configured to align and couple the magnetic core halves together when the housing 100 is disposed in the closed configuration.

As will be described more fully, the hinge 200 is unlikely to inadvertently come apart, "unsnap," or otherwise disassemble. Presently available housings, such as for a split-core current transformer, are likely to unsnap or otherwise come apart when an attempt is made to install the housing (and split-core current transformer) around a conductor that is too large for the opening 103. The embodiments of the present disclosure, with the hinge 200, are more likely to remain intact during such attempt to install around a conductor that is too large.

As shown in FIG. 1C, the upper housing part 110 comprises an end wall 111, a side wall 112, and an opposing side wall 113 opposite the side wall 112. The hinge 200 comprises a first hinge part 210 and a second hinge part 220 (e.g., a keyed hinge part), both of which are disposed on or at a hinge axis $A_h$ and are configured for rotation about the hinge axis $A_h$. As shown, the first hinge part 210 is disposed adjacent an outside surface of the opposing side wall 113 and the second hinge part 220 is disposed adjacent an outside surface of the opposing side wall 112.

Figure 2:
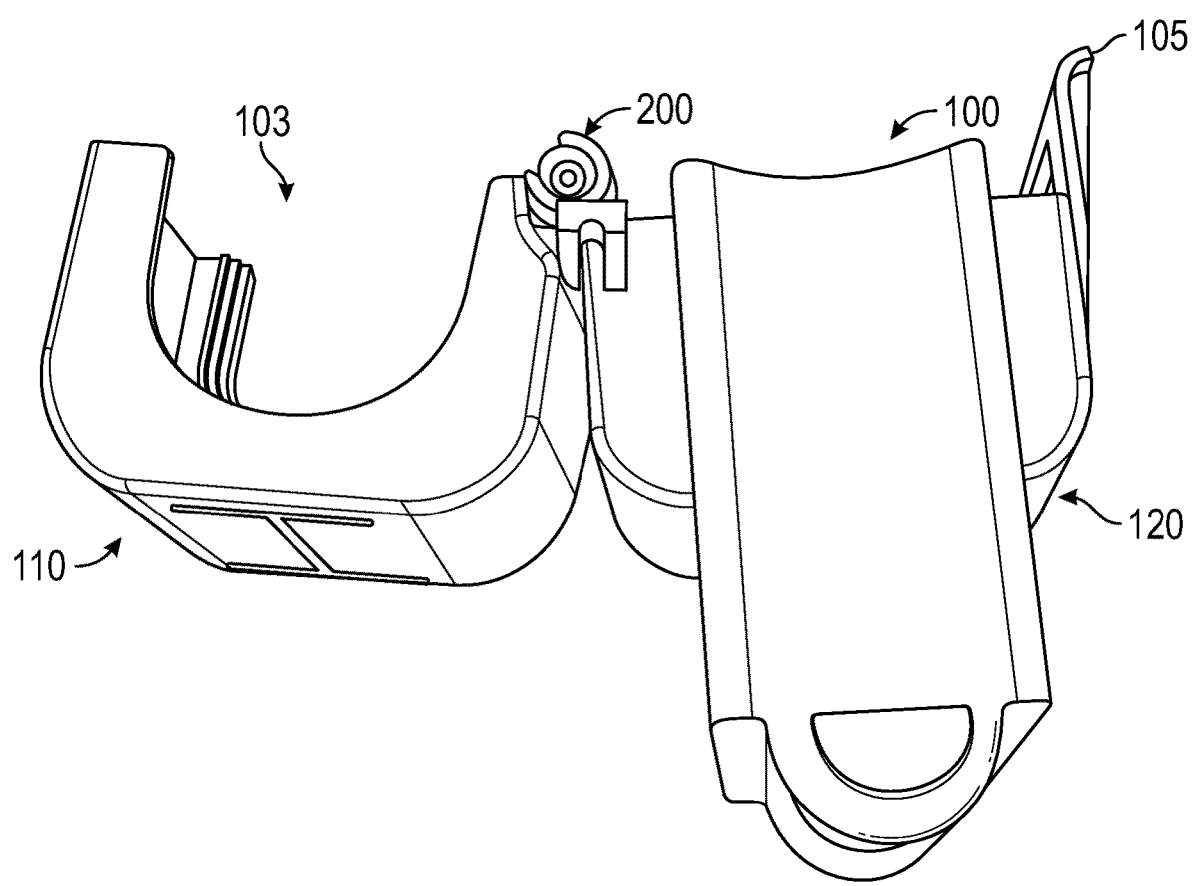
FIG. 2 is a side view of the housing of FIG. 1A in an open configuration.

FIG. 2 illustrates the housing 100 in an open configuration. As shown, the upper housing part 110 may be rotated with respect to lower housing part 120 about the hinge axis $A_h$ by about 180 degrees so as to open the housing 100. By rotating 180 degrees to an open configuration (e.g., a fully open configuration), unimpeded access to the partial cutouts of the magnetic core halves is afforded. When the housing 100 is disposed in a fully open configuration, the housing 100 may more readily receive the one to more conductors in the opening 103 than if the housing 100 were incapable of fully opening or otherwise disposed in a less than a fully open configuration (e.g., less than 180 degrees). In some instances, characteristics of the one or more conductors such as quantity, stiffness, size, and position in relation to other objects may present difficulty to the user enclosing the one or more conductors within the opening 103 of the housing 100. Hence, disposing the housing 100 in a fully open configuration and thereby making the opening 103 (and cutouts of the magnetic core halves) fully accessible in at least one direction may be advantageous to the user. For example, a user may position the one or more conductors adjacent the open end of the lower housing part 120 and then rotate the upper housing part 110 toward the closed configuration. Similarly, the user may position the one or more conductors adjacent the opening 103 defined by the upper housing part 110 and then rotate the lower housing part 120 toward the closed configuration.

Figure 3:
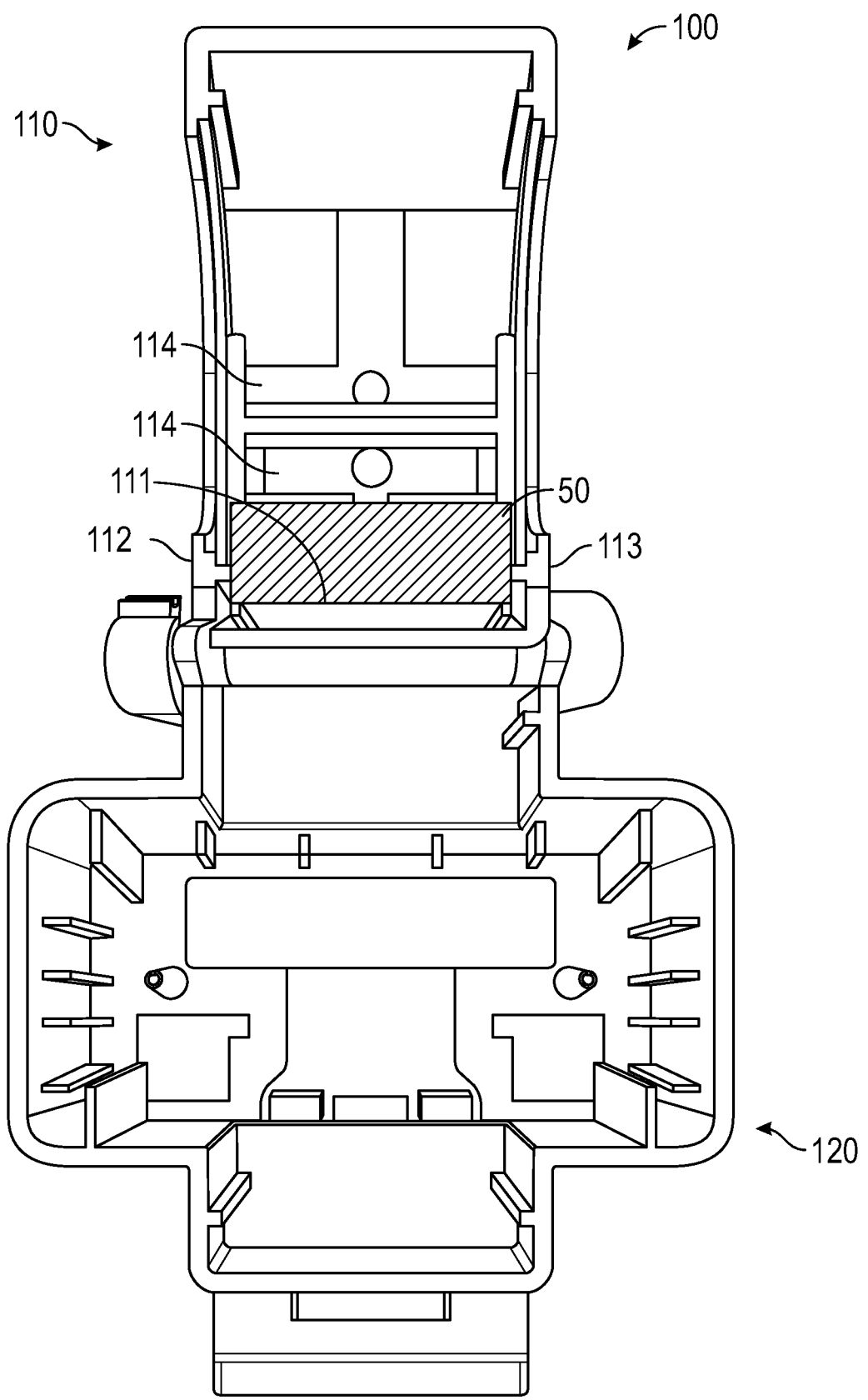
FIG. 3 is a top view of the housing of FIG. 1A in an open configuration.

FIG. 3 is a top view of the housing 100 in the open configuration. Also shown for reference is a portion of a magnetic core half 50 as may be disposed in the upper housing part 110. As shown, the magnetic core half 50 may be disposed adjacent the end wall 111 and between the side walls 112, 113. The upper housing part 110 may comprise one or more biasing members 114. The biasing members 114 may exert a force on the magnetic core half 50 disposed in the upper housing part 110 toward a corresponding magnetic core half (not shown) disposed in the lower housing part 120 to ensure that the two magnetic core halves are secured flush together when the housing 100 is in the closed configuration. In the illustrated embodiment, the biasing members 114 may comprise flexible portions of the upper housing part 110.

Figure 4B:
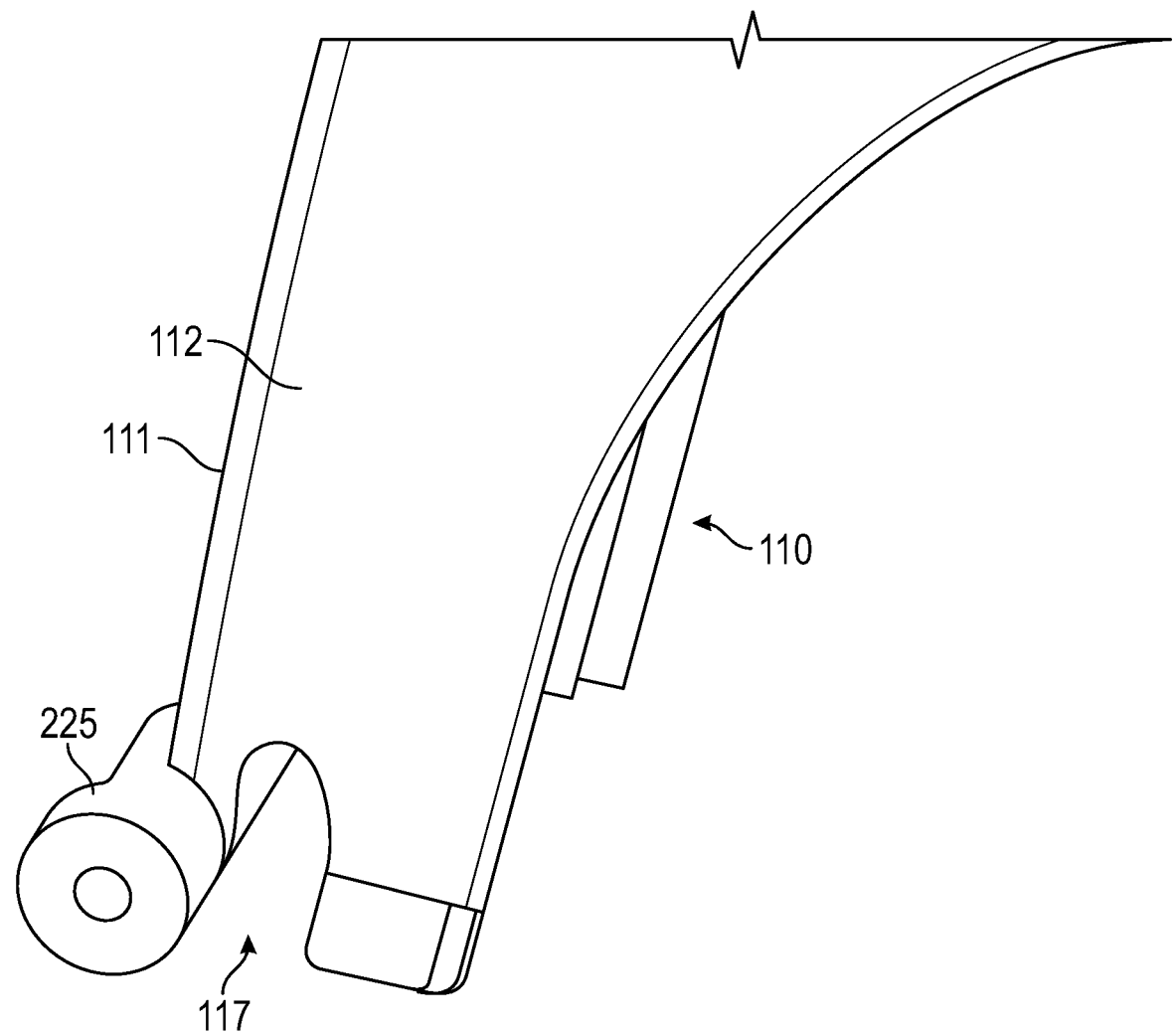
FIG. 4B is a side detail view of a hinge portion of the upper housing part.

FIGS. 4A and 4B illustrate details of the hinge 200. As shown, the upper housing part 110 comprises a first pin 215 of the first hinge part 210 and a second pin 225 (or keyed pin) of the second hinge part 220. The pins 215, 225 may comprise extensions of the end wall 111, such that the first pin 215 protrudes laterally from the side wall 113 and the keyed pin 225 protrudes laterally from the opposing side wall 112. Accordingly, the pin 215 extends in an opposite direction to the keyed pin 225. The pin 215 may comprise a cylindrical shape along its entire length. The keyed pin 225 may comprise a cylindrical portion 230 disposed at a free end of the keyed pin 225 and a key portion 231 (e.g., a notched or cut-away portion) disposed inward of the cylindrical portion 230. The key portion 231 defines a cross-sectional dimension that corresponds to a slot on the knuckle—e.g., the key portion 231 may be keyed to a slot of the knuckle. The key portion 231 of the embodiment of FIG. 4A defines a cross-sectional dimension that is smaller than the diameter of the cylindrical portion 230. In some embodiments, a transverse cross-section of the key portion 231 may comprise a D-shape. The key portion 231 may extend inward beyond the side wall 112. The key portion 231 may be oriented so as to be in angular alignment with the end wall 111. In some embodiments, the flat portion of the D-shaped key portion 231 may be parallel with the end wall 111.

As shown in FIG. 4B, the side wall 112 comprises a cutout or key slot 117 extending through the side wall 112. The key slot 117 may be adjacent to and may extend partially around the keyed pin 225. A size (e.g., width) and/or shape of the key slot 117 may correspond to a feature of the knuckle 325 (see FIGS. 5A, 5B) as further described below.

FIG. 5A illustrates further detail of the hinge 200. As shown, the lower housing part 120 comprises a knuckle 315 of the hinge part 210 and a keyed knuckle 325 of hinge part 220. The knuckles 315 and 325 comprise inward sides 318 and 328, respectively. The knuckle 315 defines a hollow or a hollow cylinder having an opening 316 therein or therethrough sized to correspond with and receive the cylindrical pin 215. In some embodiments, the opening 316 is a hollow or indentation in the knuckle 315 to correspond with an end of a hinge pin and may not extend through the knuckle 315. In other embodiments, the opening 316 extends entirely through the knuckle 315. The keyed knuckle 325 comprises a hollow cylinder with a knuckle slot 327 extending through the cylindrical wall so as to define a C-shape, the knuckle slot 327 extending from the inward side 328 to an outward side 330 of the keyed knuckle 325. An opening 326 of or defined by the keyed knuckle 325 is sized (e.g., has a diameter) to correspond with the cylindrical portion 230 of the keyed pin 225. The knuckle slot 327 is sized to correspond to the key portion 231 of the keyed pin 225. In other words, a width 327w and/or an arc (within the circumference of the knuckle) of the knuckle slot 327 is sized to allow passage of the key portion 231 of the keyed pin 225 therethrough and to limit or even prevent passage of the cylindrical portion 230 therethrough. Furthermore, the knuckle slot 327 and the key portion 231 are correspondingly configured such that passage of the key portion 231 through the knuckle slot 327 is (1) allowed when the smaller cross-sectional dimension of the key portion 231 is angularly aligned with the knuckle slot 327 and (2) prevented when the smaller cross-sectional dimension of the key portion 231 is not in angular alignment with the knuckle slot 327. A key tip 332 (or top portion) of the keyed knuckle 325 is shaped and positioned to form the knuckle slot 327, to engage a cylindrical portion of a key pin, and to fit within a key slot in a side wall of an upper housing part.

The configuration of the key portion 231 to fit through the knuckle slot 327 while the key tip 332 is received within a key slot (a "keyed configuration") makes inadvertent disassembly of the hinge highly improbably and unlikely. The keyed configuration provides a purpose-driven difficulty for the hinge inadvertently come apart. Unlike some presently available mass-producible hinges that snap together and "unsnap" when a force (e.g., a radial force with respect to the hinge axis) on the hinge is sufficient, the keyed configuration provides a robust hinge that is relatively difficult to cause to inadvertently disassemble.

Figure 5B:
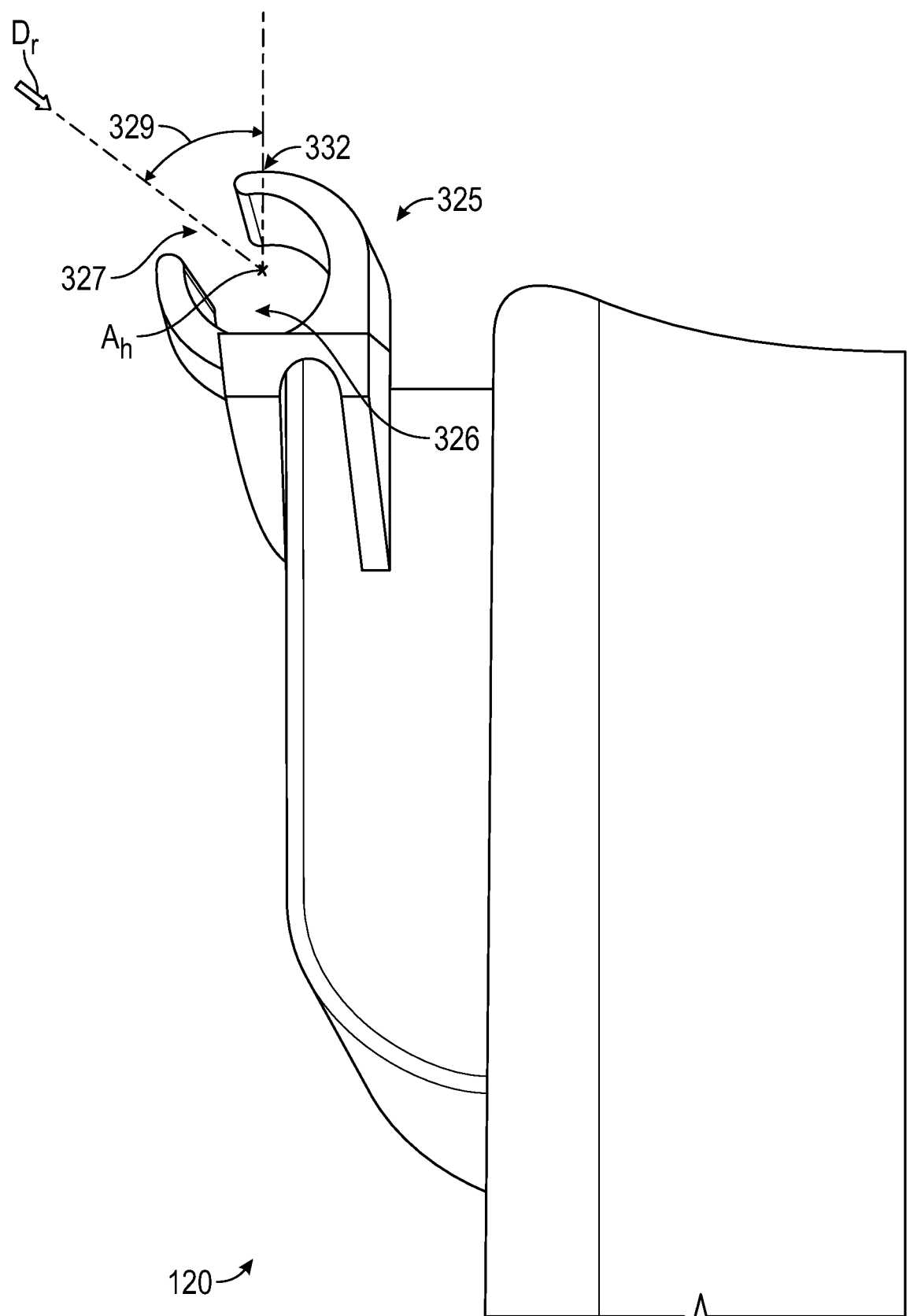
FIG. 5B is a side detail view of the hinge portion of the lower housing part.

FIG. 5B is a side view of a portion of the lower housing part 120 showing the keyed knuckle 325 and the knuckle slot 327. The knuckle slot 327 is disposed at an angle 329 (e.g., a key angle) with respect to the lower housing part 120. The knuckle slot 327 allows access to the opening 326 in a radial direction Dr with respect to the hinge axis $A_h$. The radial direction Dr is also transverse to the hinge axis $A_h$ at an orientation corresponding to the angle 329. In the illustrated embodiment, the angle 329 as shown may be about 45 degrees. The orientation of the knuckle slot 327 also provides for a key tip 332 (or top portion) of the keyed knuckle 325 to extend over the cylindrical opening of the keyed knuckle 325. The extension of the key tip 332 may tend to prevent separation of the upper housing part 110 away from the lower housing part 120 when the one or more conductors exert a separating force on the upper and lower housing parts 110, 120.

Unintentional, inadvertent, or accidental separation of the upper housing part 110 away from the lower housing part 120 is highly unlikely because orientation of the upper housing part 110 relative to the lower housing part 120 at the angle 329 (such that the key tip 332 aligns with the key slot) does not occur in normal usage of the housing, during closure of the first housing part with the second housing part to close the housing, and/or during operation of a device housed by the housing. Further, even if rotation of the upper housing part 110 relative to the lower housing part 120 were to stop at the angle 329, disassembly further requires axial movement, displacement, or separation of the upper housing part 110 from the lower housing part 120 in an axial direction along the hinge axis $A_h$.

Figure 6A:
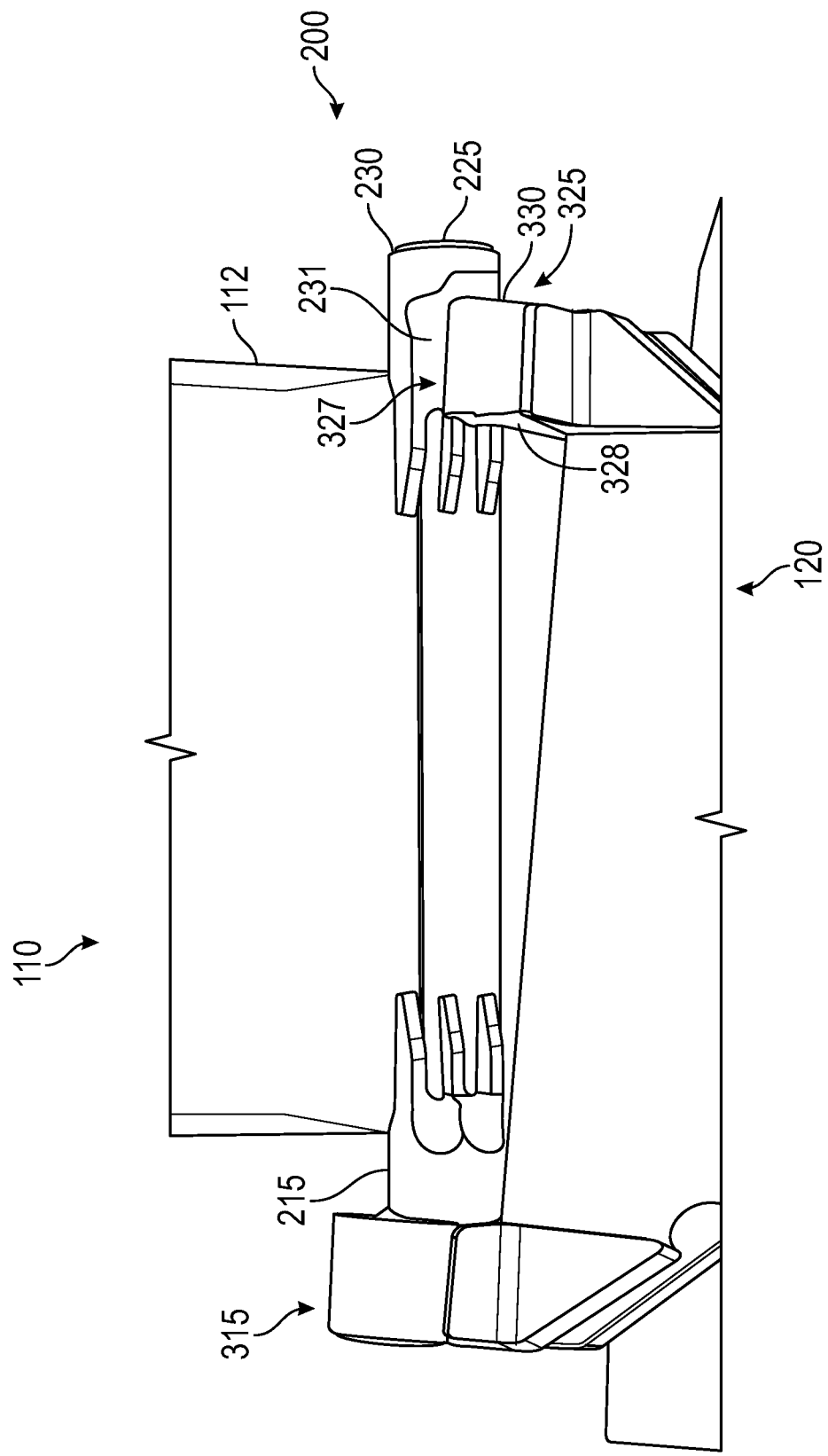
FIG. 6A is a rear detail view of the hinge in a first partial assembly state.
Figure 6B:
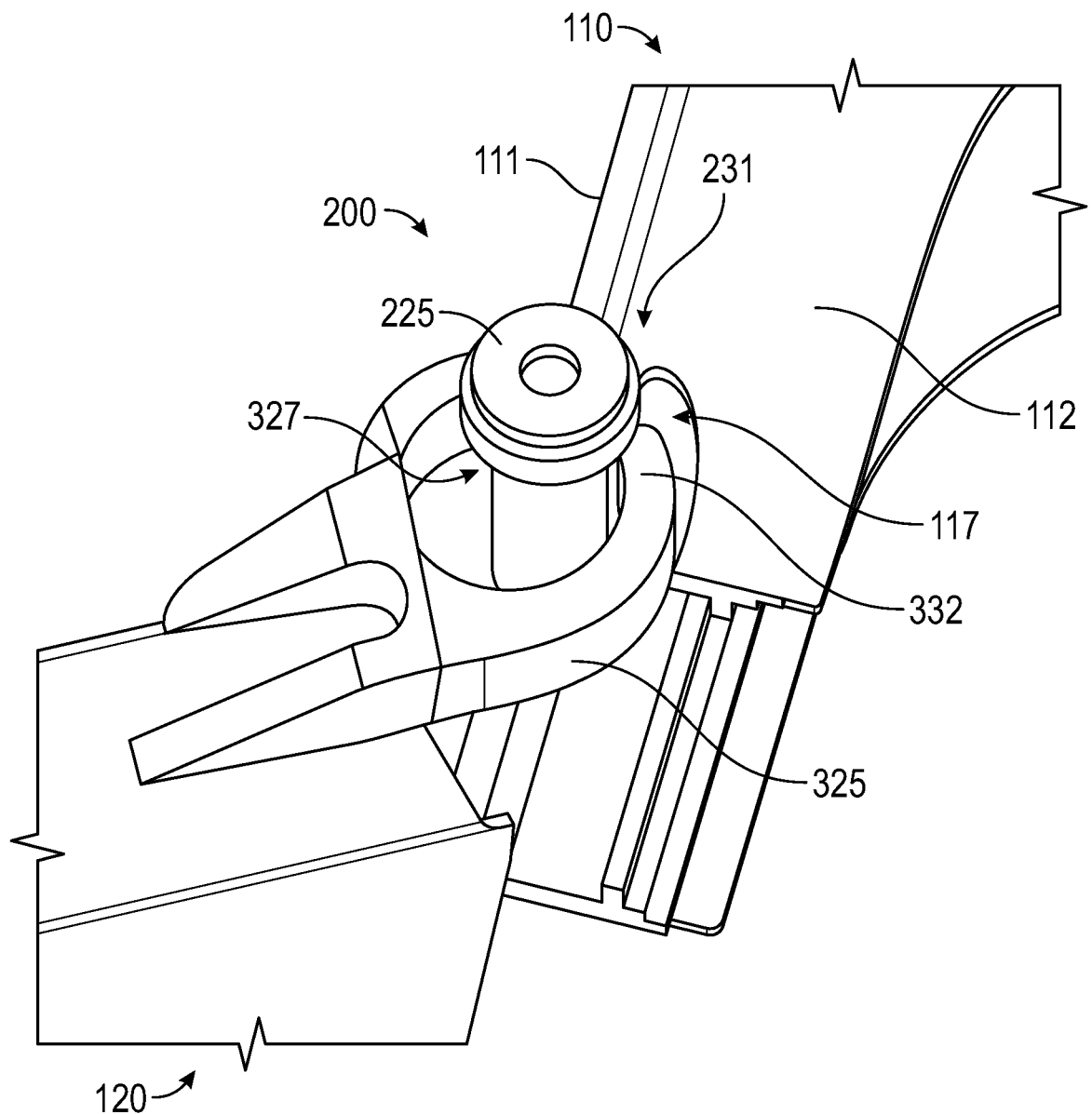
FIG. 6B is a side detail view of the hinge in the first partial assembly state of FIG. 6A.

FIGS. 6A and 6B illustrate the hinge 200 in a first partial state of assembly. The first pin 215 is partially inserted into the knuckle 315. The key portion 231 of the second or keyed pin 225 is aligned with the knuckle slot 327 (see FIG. 6B) and is partially disposed within the knuckle slot 327 of the keyed knuckle 325. The cylindrical portion 230 of the keyed pin 225 is disposed beyond the outward side 330 of the keyed knuckle 325, i.e., out of the keyed knuckle 325. The side wall 112 is positioned between the inward side 328 and the outward side 330 of the keyed knuckle 325. As such, a portion of the keyed knuckle 325 is disposed within the key slot 117 as shown in FIG. 6B.

As described above, the key portion 231 of the keyed pin 225 is aligned with the end wall 111 of the upper housing part 110 and the knuckle slot 327 is disposed at the key angle (e.g., about a 45-degree angle 329 as shown in FIG. 5B) with respect to the lower housing part 120. Therefore, disposition of the hinge 200 in the first assembly state is only allowed when the upper housing part 110 is disposed at the key angle (e.g., the 45-degree angle 329 shown in FIG. 5B) with the lower housing part 120. In other words, disposition of the hinge 200 in the first partial assembly state is prevented unless the upper housing part 110 is disposed at an appropriate angle (e.g., the key angle 329) with respect to the lower housing part 120. To both accommodate the key tip 332 portion of the keyed knuckle 325 and direct and require orientation of the upper housing part 110 at the key angle, the key slot 117 is configured to receive the key tip 332 of the keyed knuckle 325 during assembly.

Figure 7A:
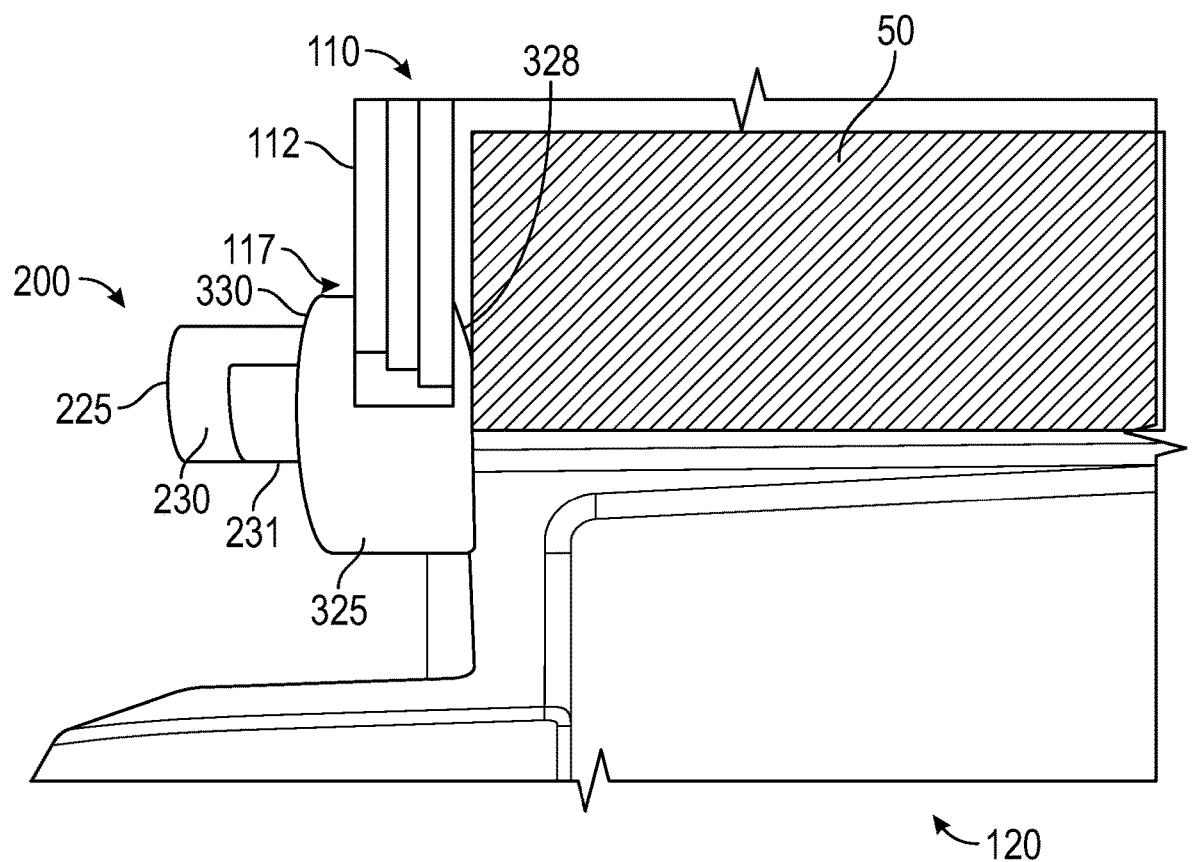
FIG. 7A is a front detail view of the hinge in a second partial assembly state.
Figure 7B:
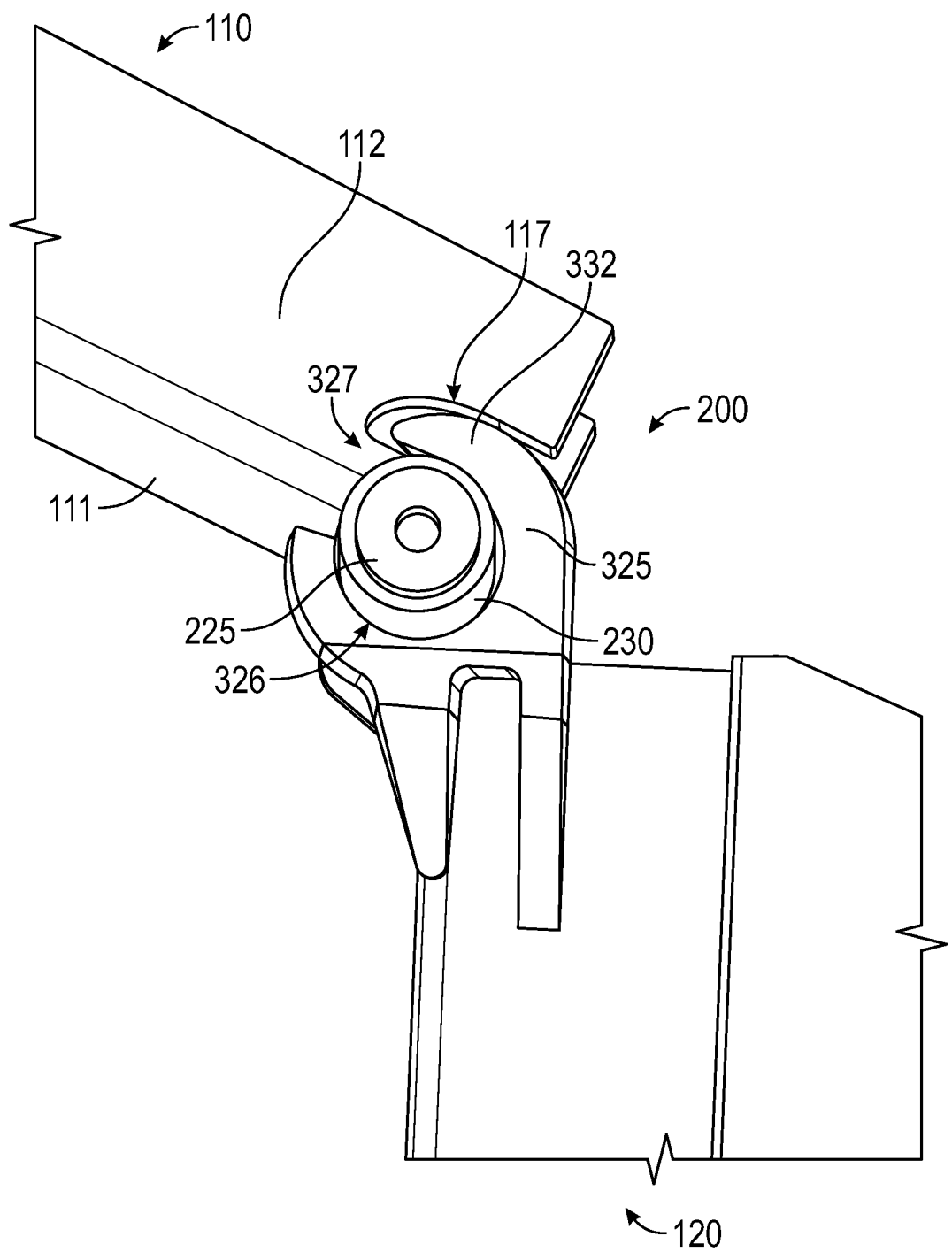
FIG. 7B is a side detail view of the hinge in the second partial assembly state of FIG. 7A.

FIGS. 7A and 7B illustrate the hinge 200 in a second partial state of assembly. A portion of the magnetic core half 50 is shown for reference. The keyed pin 225 is partially inserted into the keyed knuckle 325 (approximately the same amount as shown in FIG. 6A). The key portion 231 of the keyed pin 225 is aligned with the knuckle slot 327 (see FIG. 7B) and is disposed entirely within the keyed knuckle 325, such that the key portion 231 is within the opening 326 and no portion of the key portion 231 is disposed in the knuckle slot 327. As the side wall 112 is positioned between the inward side 328 and the outward side 330 of the keyed knuckle 325, a portion of the end wall 111 is disposed within the knuckle slot 327. The cylindrical portion 230 of the keyed pin 225 remains disposed laterally out of the keyed knuckle 325. As shown in FIG. 6B, the key tip 332 portion of the keyed knuckle 325 within the key slot 117 is extended further in toward the end of the key slot 117. As such, the key slot 117 provides for displacement of the key portion 231 of the keyed pin 225 into the keyed knuckle 325 while the side wall 112 is disposed between the inward side 328 and the outward side 330 of the keyed knuckle 325. In other words, the key slot 117 accommodates a top portion or the key tip 332 of the keyed knuckle 325 to provide for displacement of the key portion 231 of the keyed pin 225 into the keyed knuckle 325 when the first pin 215 is only partially disposed within the first knuckle 315 (as shown in FIG. 6A).

Relatedly, disassembly of the hinge 200 also occurs when the upper housing part 110 is disposed at the key angle with the lower housing part 120, as shown in FIGS. 6A, 6B, 7A, and 7B. In other words, disassembly of the hinge 200 is limited or even prevented unless the upper housing part 110 is disposed at an appropriate angle (e.g., the key angle 329) with respect to the lower housing part 120. As will be described below with reference to FIG. 8, complete assembly of the hinge 200 includes shifting of the upper housing part 110 relative to the lower housing part 120, which transitions the hinge from assembly in a keyed configuration in the second assembly state to the state in FIG. 8; in essence a locked configuration, according to some embodiments, in which inadvertent disassembly of the hinge 200 is highly unlikely. To inadvertently disassemble from the completely assembled state shown in FIG. 8, the upper housing part 110 would: (i) inadvertently rotate to and stop at the key angle (e.g., the key angle 329 of FIG. 5B) with respect to the lower housing part 120, (ii) inadvertently shift in an axial direction along the hinge axis to the state shown in FIGS. 7A and 7B, (iii) and then inadvertently transition to the state shown in FIGS. 6A and 6B, all of which are highly unlikely to inadvertently occur.

Figure 8:
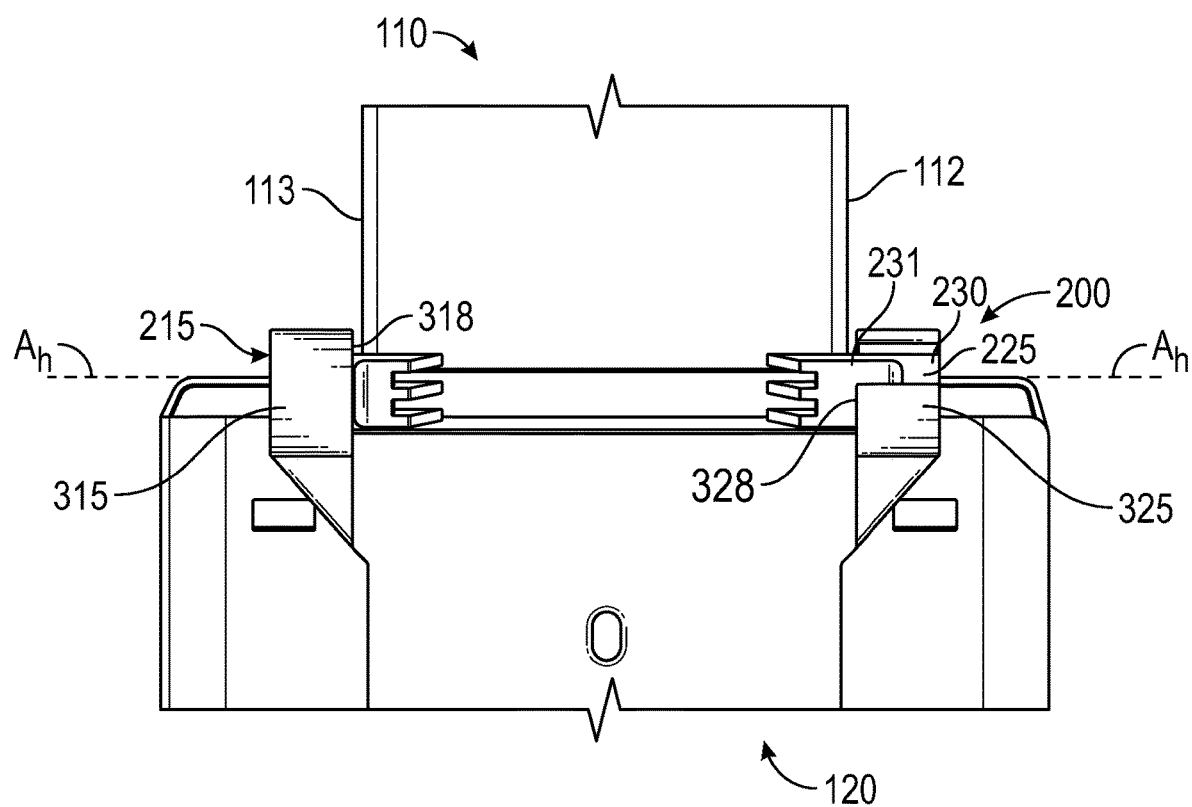
FIG. 8 is a rear detail view of the hinge in a final assembly state.

FIG. 8 is a rear view of the hinge 200 in a fully assembled state. The position of the upper housing part 110 is shown shifted or disposed laterally of the position shown in FIGS. 6A and 7A. The pin 215 is fully inserted into the knuckle 315. The key portion 231 and the cylindrical portion 230 of the keyed pin 225 are disposed within the keyed knuckle 325. The side walls 112, 113 of the upper housing part 110 are disposed between the inward sides 318, 328 of the knuckles 315, 325, respectively. The hinge axis $A_h$ is clearly established with the hinge pins 215, 225 aligned with the knuckles 315, 325, respectively.

Assembly of the hinge 200 may comprise the following steps. The assembler may partially insert the pin 215 in the knuckle 315. In some instances, such as when a magnetic core half 50 is disposed in the upper housing part 110, the assembler may insert the pin 215 into the knuckle 315 until the inward side 328 of the keyed knuckle 325 is disposed outward of the magnetic core half 50. The assembler may orient the upper and lower housing parts 110, 120 such that the upper housing part 110 is disposed at a key angle of rotation about the hinge axis (e.g., the angle 329 of about 45 degrees as shown in FIG. 5B) with respect to the lower housing part 120. The assembler may displace the key portion 231 of the keyed pin 225 through the knuckle slot 327 and into the keyed knuckle 325 during which a portion of the keyed knuckle 325 is also displaced into the key slot 117. The assembler may displace the upper housing part 110 along the hinge axis $A_h$ so as to further insert the pin 215 into the knuckle 315 and thereby displace the cylindrical portion 230 of the keyed pin 225 into the keyed knuckle 325. The assembler may then rotate the upper housing part 110 with respect to the lower housing part 120 away from the key angle 329.

Disassembly of the hinge 200 may comprise the following steps. The disassembler may orient the upper and lower housing parts 110, 120 such that the upper housing part 110 is disposed at the key angle 329 (e.g., about 45 degrees) relative to the lower housing part 120. The disassembler may displace the housing part 110 along the hinge axis $A_h$ so as to displace the cylindrical portion 230 of the keyed pin 225 out of the keyed knuckle 325. In some instances, such as when a magnetic core half 50 is disposed in the upper housing part 110, displacement of the cylindrical portion 230 out of the keyed knuckle 325 may correspond to abutment of the inward side 328 of the keyed knuckle 325 with the magnetic core half 50. The disassembler may displace the key portion 231 of the keyed pin 225 out through the knuckle slot 327 of the keyed knuckle 325. The disassembler may extract the pin 215 from the knuckle 315.

Figure 9:
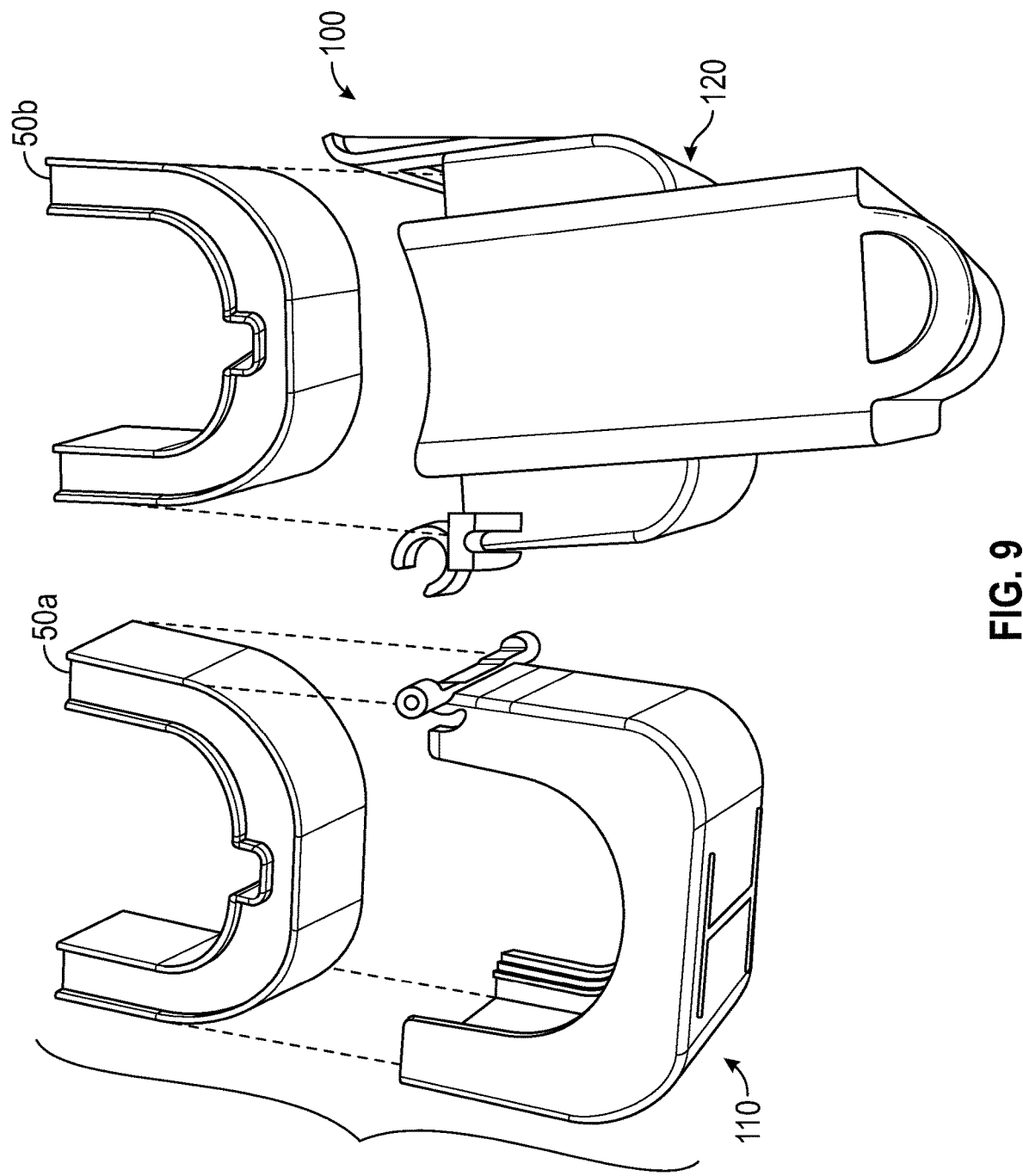
FIG. 9 is an exploded view of a housing of a split-core current transformer, according to one embodiment.

FIG. 9 is an exploded view of a housing 100 of a split-core current transformer, according to one embodiment. The housing 100 includes an upper housing part 110 and a second housing part 120 shown separated from each other. Each housing part 110, 120 is configured to house a core half 50a, 50b, respectively.

EXAMPLES

Some examples of embodiments of the present disclosure are provided here.

Example 1. A housing, comprising: a first knuckle and a second knuckle, which may be integrally formed with and/or coupled to a first housing part, the first and second knuckles each forming an opening to receive a hinge pin, the openings in alignment to thereby define a hinge axis, the second knuckle comprising a knuckle slot extending through a cylindrical wall of the second knuckle to allow access to the opening of the second knuckle in a radial direction with respect to the hinge axis; and a first hinge pin and a second hinge pin in alignment and to align with the hinge axis, the first and second hinge pins coupled to a second housing part and extending from the second housing part in opposite directions, the first hinge pin having a cylindrical shape and having a diameter corresponding to a diameter of the opening of the first knuckle, and the second hinge pin comprising a cylindrical portion corresponding to a diameter of the opening of the second knuckle and a key portion configured (e.g., sized, having a width and thickness) to allow passage of the key portion through the knuckle slot of the second knuckle and into the opening of the second knuckle, wherein at assembly the first hinge pin is to be disposed within and aligned with the opening of the first knuckle and the second hinge pin is to be disposed within and aligned with the second knuckle after passage of the key portion through the knuckle slot of the second knuckle to position the key portion and the cylindrical portion of the second hinge pin within the opening of the second knuckle, wherein alignment of the first and second hinge pins with the first and second knuckles forms a hinge that facilitates rotation of the first housing part relative to the second housing part around the hinge axis.

Example 2. The housing of example 1, wherein the first housing part and second housing part are each mass-producible.

Example 3. The housing of example 1, wherein the first housing part and second housing part are each injection-moldable Example 4. The housing of example 1, wherein the first housing part and second housing part define a cavity to house an object.

Example 5. The housing of example 4, wherein the housing is for a split-core current transformer.

Example 6. The housing of example 1, wherein the knuckle slot is configured (e.g., sized, shaped) to prevent passage therethrough of the cylindrical portion of the second hinge pin.

Example 7. The housing of example 1, wherein the first hinge pin is coupled to a first side wall of the second housing part and the second hinge pin is coupled to a second side wall of the second housing part that is opposite the first side wall.

Example 9. The housing of example 8, wherein the second side wall comprises a key slot adjacent the second hinge pin, the key slot extending through the second side wall and configured to receive a portion of the second knuckle during passage of the key portion of the second hinge pin through the knuckle slot.

Example 10. The housing of example 1, wherein a side wall of the second housing part comprises a key slot adjacent the second hinge pin, the key slot extending through the side wall and configured to receive a portion of the second knuckle during passage of the key portion of the second hinge pin through the knuckle slot.

Example 11. The housing of example 10, wherein, at assembly of the housing, the key slot receives the portion of the second knuckle and then the second housing part is displaced relative to the first housing part in an axial direction along the hinge axis to disengage the key slot from the portion of the second knuckle and to position the cylindrical portion of the second hinge pin within the opening of the second knuckle.

Example 12. The housing of example 11, wherein disassembly of the housing to uncouple the first housing part from the second housing part (and thereby disassemble the hinge) is possible only by rotational alignment of the key slot in the side wall of the second housing part with the portion of the second knuckle and axial displacement of the second housing part with respect to the first housing part along the hinge axis, thereby making accidental disassembly unlikely, if not nearly impossible.

Example 13. The housing of example 12, wherein a transverse cross-section of the key portion of the second hinge pin comprises a semi-circular shape (e.g., a "D-shape").

Example 14. The housing of example 1, wherein the second hinge pin is insertable into the second knuckle through the knuckle slot only when the key portion of the second hinge pin is aligned with the knuckle slot and the first housing part and the second housing part are disposed at a defined angle with respect to each other.

Example 15. The housing of example 14, wherein the defined angle is defined by one or more of the shape and interface (or interaction) of each of the key portion and the knuckle slot relative to each other.

Example 16. The housing of example 14, wherein the defined angle, to reverse assembly of (or disassemble) the hinge, is an angle that does not occur in normal usage of the housing, during closure of the first housing part with the second housing part to close the housing, and during operation of a device housed by the housing.

Example 17. The housing of example 1, wherein at assembly, after passage of the key portion through the knuckle slot of the second knuckle, the second housing part is displaced relative to the first housing part in an axial direction along the hinge axis to position the cylindrical portion of the second hinge pin within the opening of the second knuckle.

Example 18. A mass-producible housing, comprising: an injection-molded first housing part including a knuckle and a keyed knuckle in alignment to define a hinge axis, the keyed knuckle displaced from the knuckle a distance along the hinge axis, the keyed knuckle comprising a knuckle slot extending through a cylindrical wall of the keyed knuckle to provide transverse (or radial) access to an opening defined by the keyed knuckle, the transverse (or radial) access in a direction transverse to the hinge axis; and an injection-molded second housing part comprising: a side wall at least partially defining a cavity of the housing; a hinge pin integrally molded with and extending laterally in a direction from the side wall, the hinge pin having a cylindrical shape with a diameter to be received by an opening or hollow of the knuckle; an opposing side wall also at least partially defining the cavity of the housing; and a keyed hinge pin integrally molded with and extending laterally from the opposing side wall in a direction opposite the direction of the hinge pin, the keyed hinge pin comprising a cylindrical portion and a key portion, the cylindrical portion with a diameter corresponding to the opening of the keyed knuckle, the key portion configured (e.g., sized, having a width and thickness) to allow passage of the key portion through the knuckle slot of the keyed knuckle in a direction transverse or radial to the hinge axis and into alignment with the opening of the second knuckle.

Example 19. The housing of example 18, wherein the first housing part and second housing part define a cavity to house an object.

Example 20. The housing of example 19, wherein the sidewall and opposing sidewall of the second housing part at least partially define the cavity.

Example 21. The housing of example 19, wherein the housing is for a split-core current transformer and a first portion of the cavity defined by the first housing part is to house a first half of the split-core current transformer and a second portion of the cavity defined by the second housing part is to house a second half of the split-core current transformer.

Example 22. The housing of example 18, wherein at assembly the hinge pin is to be inserted into an opening or hollow defined by the knuckle along the hinge axis and the keyed hinge pin is to be inserted into the keyed knuckle in a direction transverse (or radial) to the hinge axis.

Example 23. The housing of example 18, wherein the keyed hinge pin is insertable into the keyed knuckle through the knuckle slot only when the key portion is aligned with the knuckle slot and the first housing part and the second housing part are disposed at a defined angle with respect to each other.

Example 24. The housing of example 23, wherein the defined angle is defined by one or more of the shape and interface of each of the key portion and the knuckle slot relative to each other.

Example 25. The housing of example 23, wherein the defined angle, to reverse assembly of (or disassemble) the hinge, is an angle that does not occur in normal usage of the housing, during closure of the first housing part with the second housing part to close the housing, and during operation of a device housed by the housing.

Example 26. The housing of example 18, wherein the knuckle slot is configured (e.g., sized, shaped) to prevent passage therethrough of the cylindrical portion of the second hinge pin.

Example 27. The housing of example 18, wherein the opposing side wall comprises a key slot adjacent the keyed hinge pin, the key slot extending through the opposing side wall and configured to receive a portion of the keyed knuckle during passage of the key portion of the keyed hinge pin through the knuckle slot.

Example 28. The housing of example 27, wherein, at assembly of the housing, the key slot receives the portion of the keyed knuckle and then the second housing part is displaced relative to the first housing part in an axial direction along the hinge axis to disengage the key slot from the portion of the keyed knuckle and to position the cylindrical portion of the keyed hinge pin within the opening of the keyed knuckle, thereby forming a hinge, and wherein a disassembly of the housing to uncouple the first housing part from the second housing part (and thereby disassemble the hinge) is possible only by rotational alignment of the key slot in the side wall of the second housing part with the portion of the keyed knuckle and axial displacement of the second housing part with respect to the first housing part along the hinge axis, thereby making accidental disassembly unlikely, if not nearly impossible.

Example 29. A housing (e.g., for a split-core current transformer), comprising: a first housing part including a hinge pin comprising: a keyed end extending from the first housing part in a first direction, the keyed end of the hinge pin comprising: a cylindrical portion having a diameter; and a cut-away portion having a smaller diameter than the diameter of the cylindrical portion; and an opposing end extending from the first housing part in a second direction opposite the first direction, the opposing hinge end having a cylindrical shape; and a second housing part to rotatably couple to the first housing part, the second housing part including: a keyed knuckle forming an opening or hollow to align with a longitudinal axis of the hinge pin, which is a hinge axis, and to correspond to and receive the keyed end of a hinge pin, a diameter of the opening corresponding to the diameter of the cylindrical portion of the keyed end of the hinge pin, the keyed knuckle comprising a knuckle slot extending through a cylindrical wall of the keyed knuckle, the knuckle slot configured (e.g., sized, shaped) to allow passage therethrough of the cut-away portion of the keyed hinge pin in a radial direction with respect to the hinge axis into and out of the opening and configured (e.g., sized, shaped) to prevent passage therethrough of the cylindrical portion of the keyed hinge pin; a knuckle forming a hollow to align with the longitudinal axis of the hinge pin, which is the hinge axis, and to correspond to and receive the opposing end of the hinge pin, a diameter of the hollow corresponding to a diameter of the cylindrical shape of the opposing end of the hinge pin, wherein, at assembly of the first housing part to the second housing part in a rotatable coupling, the opposing end of the hinge pin is to be inserted in a direction along the hinge axis and aligned within the hollow of the knuckle and the cut-away portion of the keyed end of the hinge pin is to pass through the knuckle slot of the keyed knuckle in a direction transverse to the hinge axis to then position and align the cylindrical portion of the keyed end within the opening of the keyed knuckle, wherein, after assembly, the cylindrical portion of the keyed end of the hinge pin is rotatable within the keyed knuckle and the opposing end of the hinge pin is rotatable within the hollow of the knuckle forming a hinge to facilitate rotation of the first housing part relative to the second housing part about a hinge axis.

Example 30. The housing of example 29, wherein the keyed end of the hinge pin extends outward from a side wall of the first housing part and the opposing end of the hinge pin extends outward from an opposite side wall of the first housing part, and wherein the side wall comprises a key slot adjacent the keyed end of the hinge pin, the key slot extending through the side wall and configured to receive a portion of the keyed knuckle during passage of the cut-away portion of the keyed end of the hinge pin through the knuckle slot of the keyed knuckle.

Example 31. The housing of example 29, wherein the first housing part comprises a key slot adjacent the keyed end of the hinge pin, the key slot configured to receive a portion of the keyed knuckle during passage of the cut-away portion of the keyed end of the hinge pin through the knuckle slot.

Example 32. The housing of example 29, wherein a transverse cross-section of the cut-away portion of the keyed end of the hinge pin comprises a "D-shape."

Example 33. The housing of example 29, wherein the keyed end of the hinge pin is insertable into the keyed knuckle through the knuckle slot only when the cut-away portion of the keyed end is aligned with the knuckle slot and the first housing part and the second housing part are disposed at a defined angle with respect to each other.

Example 34. The housing of example 33, wherein the defined angle is defined by one or more of the shape and interaction of each of the cut-away portion and the knuckle slot.

Example 35. The housing of example 21, wherein the defined angle, to reverse assembly of (or disassemble) the hinge, is an angle that does not occur in normal usage of the housing, during closure of the first housing part with the second housing part to close the housing, and during operation of a device housed by the housing.

Example 36. A hinge to rotatably couple two parts, comprising: a first hinge pin coupled to a first part and extending from the first part in a first direction, the first hinge pin having a cylindrical shape; a second hinge pin coupled to the first part and extending from the first part in a second direction opposite the first direction and in alignment with the first hinge pin to define a hinge axis, the second hinge pin comprising a cylindrical portion and a cut-away portion; a first knuckle coupled to a second part and forming a first opening to receive the first hinge pin to align with the hinge axis, the first opening having a diameter corresponding to a diameter of the cylindrical shape of the first hinge pin; a second knuckle coupled to the second part and forming a second opening to receive the second hinge pin to align with the hinge axis, the second opening in alignment with the first opening of the first knuckle to be aligned with the hinge axis, the second knuckle comprising a knuckle slot extending through a cylindrical wall of the second knuckle to allow passage therethrough of the cut-away portion of the second hinge pin into the second opening in a radial direction with respect to the hinge axis, wherein the hinge is configured to be assembled to rotatably couple the first part to the second part by positioning the first hinge pin within (and aligned with) the opening of the first knuckle and by passing the cut-away portion of the second hinge pin through the knuckle slot of the second knuckle to position the cut-away portion and the cylindrical portion of the second pin within the opening of the second knuckle, and wherein alignment of the first and second hinge pins with the first and second knuckles facilitates rotation of the first part relative to the second part around the axis of rotation.

Example 37. The hinge of example 36, wherein the knuckle slot is configured (e.g., sized, shaped) to prevent passage therethrough of the cylindrical portion of the second hinge pin.

Example 38. A housing, comprising: a first knuckle and a second knuckle, which may be integrally formed with or coupled to a first housing part, the first and second knuckles each to receive a hinge pin, the second knuckle comprising a knuckle slot extending through a cylindrical wall of the second knuckle to allow access to the second knuckle in a radial direction with respect to a hinge axis; a hinge pin coupled to a second housing part, the hinge pin comprising one or more cylindrical portions each corresponding to an inner diameter of the first knuckle and the second knuckle and a key portion configured (e.g., sized, having a width and thickness) to allow passage of the key portion through the knuckle slot of the second knuckle and into the opening of the second knuckle; and a side wall of the second housing part at least partially defining a cavity of the housing, the side wall defining a key slot adjacent the second hinge pin and extending through the side wall and configured to receive a key tip portion of the second knuckle during passage of the key portion of the second hinge pin through the knuckle slot at a defined angle, wherein, at assembly, the key slot receives the key tip portion of the second knuckle and then the second housing part is displaced relative to the first housing part in an axial direction along the hinge axis to disengage the key slot from the portion of the second knuckle and to position the cylindrical portion of the hinge pin within the second knuckle to assemble a hinge to rotatably couple the first housing part to the second housing part.

Example 39. The housing of example 38, wherein disassembly of the housing to uncouple the first housing part from the second housing part (and thereby disassemble the hinge) is possible only by rotational alignment of the key slot in the side wall of the second housing part with the portion of the second knuckle at the defined angle and axial displacement of the second housing part with respect to the first housing part in a direction along the hinge axis, thereby making accidental disassembly unlikely, if not nearly impossible.

Example 40. The housing of example 38, wherein the defined angle, to disassemble the hinge, is at an angle where rotational movement at the hinge does not normally stop during normal usage of the housing, during closure of the first housing part with the second housing part to close the housing, and during operation of a device housed by the housing.

Example 41. A housing for a current transformer, comprising: an injection-molded first housing part and an injection-molded second housing part hingedly coupled to the first housing part; and a hinge comprising: a first hinge pin and a second hinge pin, the first and second hinge pins integrally molded with the first housing part; and a first knuckle and a second knuckle defining a hinge axis, the first and second knuckles integrally molded with the first housing part, wherein upon assembly, the first hinge pin is inserted into the first knuckle along the hinge axis and the second hinge pin is inserted into the second knuckle in a direction transverse to the hinge axis.

Example 42. The housing of example 41, wherein the second hinge pin is insertable in the second knuckle only when the first housing part and the second housing part are disposed at a defined angle with respect to each other.

Example 43. The housing of example 42, wherein the angle is about 45 degrees.

In the foregoing description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment. Thus, the claims following this Detailed Description are hereby expressly incorporated into this Detailed Description, with each claim standing on its own as a separate embodiment. This disclosure includes all permutations of the independent claims with their dependent claims.

Recitation in the claims of the term "first" with respect to a feature or element does not necessarily imply the existence of a second or additional such feature or element. It will be apparent to those having reasonable skill in the art that changes may be made to the details of the above-described embodiments without departing from the underlying principles of the invention. Embodiments of the invention in which an exclusive property or privilege is claimed are defined as follows.

The invention claimed is:

1. A housing, comprising:
   a first knuckle and a second knuckle coupled to a first housing part, the first and second knuckles each forming an opening to receive a hinge pin, the openings in alignment to thereby define a hinge axis, the second knuckle comprising a knuckle slot extending through a cylindrical wall of the second knuckle to allow access to the opening of the second knuckle in a radial direction with respect to the hinge axis; and
   a monolithic second housing part comprising a first hinge pin and a second hinge pin in alignment and to align with the hinge axis, and extending from the second housing part in opposite directions, the first hinge pin having a diameter corresponding to a diameter of the opening of the first knuckle, the second hinge pin comprising a cylindrical portion corresponding to a diameter of the opening of the second knuckle and a key portion configured to allow passage of the key portion through the knuckle slot of the second knuckle,
   wherein at assembly the first hinge pin is to be disposed within the opening of the first knuckle and the second hinge pin is to be disposed within the second knuckle after the passage of the key portion through the knuckle slot of the second knuckle,
   wherein alignment of the first and second hinge pins with the first and second knuckles forms a hinge that facilitates rotation of the first housing part relative to the second housing part around the hinge axis,
   wherein a side wall of the second housing part comprises a key slot adjacent the second hinge pin, the key slot extending through the side wall in an axial direction along the hinge axis from a first surface of the side wall to a second surface of the side wall that is opposite the first surface, and
   wherein, at assembly of the housing, the key slot receives a portion of the second knuckle and then the second housing part is displaced relative to the first housing part in the axial direction along the hinge axis to disengage the key slot from the portion of the second knuckle and to position the cylindrical portion of the second hinge pin within the opening of the second knuckle.

2. The housing of claim 1, wherein the knuckle slot is configured to prevent passage therethrough of the cylindrical portion of the second hinge pin.

3. The housing of claim 1, wherein the second hinge pin extends from the side wall of the second housing part and the first hinge pin extends from an opposing side wall of the second housing part that is opposite the side wall.

4. The housing of claim 1, wherein disassembly of the housing to uncouple the first housing part from the second housing part is possible only by rotational alignment of the key slot in the side wall of the second housing part with the portion of the second knuckle and axial displacement of the second housing part with respect to the first housing part along the hinge axis.

5. The housing of claim 1, wherein a transverse cross-section of the key portion of the second hinge pin comprises a semi-circular shape.

6. The housing of claim 1, wherein the second hinge pin is insertable into the second knuckle through the knuckle slot only when the key portion of the second hinge pin is aligned with the knuckle slot and the first housing part and the second housing part are disposed at a defined angle with respect to each other.

7. The housing of claim 6, wherein the defined angle is defined by one or more of a shape and an interface of each of the key portion and the knuckle slot relative to each other.

8. A housing, comprising:
   an injection-molded first housing part including a knuckle and a keyed knuckle in alignment to define a hinge axis, the keyed knuckle displaced from the knuckle a distance along the hinge axis, the keyed knuckle comprising a knuckle slot extending through a cylindrical wall of the keyed knuckle to provide transverse access to an opening defined by the keyed knuckle, the transverse access in a direction transverse to the hinge axis; and
   a monolithic injection-molded second housing part comprising:
   a side wall;
   a hinge pin extending laterally in a direction from the side wall, the hinge pin having a cylindrical shape to be received by the knuckle;
   an opposing side wall; and
   a keyed hinge pin extending laterally from the opposing side wall in a direction opposite the direction of the hinge pin, the keyed hinge pin comprising a cylindrical portion and a key portion, the cylindrical portion corresponding to the opening of the keyed knuckle, the key portion configured to allow passage of the key portion through the knuckle slot of the keyed knuckle,
   wherein the opposing side wall comprises a key slot adjacent the keyed hinge pin, the key slot extending through the opposing side wall in an axial direction along the hinge axis from a first surface of the opposing side wall to a second surface of the opposing side wall that is opposite the first surface, and wherein a disassembly of the housing to uncouple the first housing part from the second housing part is possible only by rotational alignment of the key slot in the side wall of the second housing part with a portion of the keyed knuckle and axial displacement of the second housing part with respect to the first housing part in the axial direction along the hinge axis.

9. The housing of claim 8, wherein at assembly the hinge pin is to be inserted into the knuckle along the hinge axis and the keyed hinge pin is to be inserted into the keyed knuckle in the direction transverse to the hinge axis.

10. The housing of claim 8, wherein the keyed hinge pin is insertable into the keyed knuckle through the knuckle slot when the key portion is aligned with the knuckle slot and the first housing part and the second housing part are disposed at a defined angle with respect to each other.

11. The housing of claim 10, wherein the defined angle is defined by one or more of a shape and an interface of each of the key portion and the knuckle slot relative to each other.

12. The housing of claim 8, wherein the knuckle slot is configured to prevent passage therethrough of the cylindrical portion of the keyed hinge pin.

13. The housing of claim 8, wherein, at assembly of the housing, the key slot receives the portion of the keyed knuckle and then the second housing part is displaced relative to the first housing part in an axial direction along the hinge axis to disengage the key slot from the portion of the keyed knuckle and to position the cylindrical portion of the keyed hinge pin within the opening of the keyed knuckle.

14. A housing, comprising:
a first monolithic housing part including a hinge pin comprising:
  a keyed end extending from the first housing part in a first direction, the keyed end comprising: a cylindrical portion having a diameter and a cut-away portion having a smaller diameter than the diameter of the cylindrical portion; and
  an opposing end extending from the first housing part in a second direction opposite the first direction, the opposing end having a cylindrical shape; and
a second housing part to rotatably couple to the first housing part, the second housing part including:
  a keyed knuckle forming an opening to correspond to and receive the keyed end of the hinge pin, a diameter of the opening corresponding to the diameter of the cylindrical portion of the keyed end of the hinge pin, the keyed knuckle comprising a knuckle slot extending through a cylindrical wall of the keyed knuckle, the knuckle slot configured to allow passage therethrough of the cut-away portion of the keyed end in a radial direction with respect to a hinge axis into and out of the opening and configured to prevent passage therethrough of the cylindrical portion of the keyed end;
  a knuckle forming a hollow to correspond to and receive the opposing end of the hinge pin, a diameter of the hollow corresponding to a diameter of the cylindrical shape of the opposing end of the hinge pin, wherein, at assembly of the first housing part to the second housing part in a rotatable coupling, the opposing end of the hinge pin is to be inserted within the hollow of the knuckle and the cut-away portion of the keyed end of the hinge pin is to pass through the knuckle slot of the keyed knuckle to then position the cylindrical portion of the keyed end within the opening of the keyed knuckle, wherein, after assembly, the cylindrical portion of the keyed end of the hinge pin is rotatable within the keyed knuckle and the opposing end of the hinge pin is rotatable within the hollow of the knuckle forming a hinge to facilitate rotation of the first housing part relative to the second housing part about the hinge axis, wherein the first housing part comprises a key slot adjacent the keyed end of the hinge pin, the key slot extending through a side wall of the first housing part in an axial direction along the hinge axis from a first surface of the side wall to a second surface of the side wall that is opposite the first surface, and wherein, at assembly of the housing, the key slot receives a portion of the keyed knuckle and then the second housing part is displaced relative to the first housing part in the axial direction along the hinge axis to disengage the key slot from the portion of the keyed knuckle and to position the cylindrical portion of the keyed end within the opening of the keyed knuckle.

15. The housing of claim 14, wherein the keyed end of the hinge pin extends outward from the side wall of the first housing part and the opposing end of the hinge pin extends outward from an opposite side wall of the first housing part.

16. The housing of claim 14, wherein the keyed end of the hinge pin is insertable into the keyed knuckle through the knuckle slot only when the cut-away portion of the keyed end is aligned with the knuckle slot and the first housing part and the second housing part are disposed at a defined angle with respect to each other.

17. The housing of claim 16, wherein the defined angle, to reverse assembly of the hinge, is an angle that does not occur in normal usage of the housing, during closure of the first housing part with the second housing part to close the housing, and during operation of a device housed by the housing.

\* \* \* \* \*